United States Patent
Suzuki et al.

(10) Patent No.: US 7,611,965 B2
(45) Date of Patent: Nov. 3, 2009

(54) SEMICONDUCTOR DEVICE AND MANUFACTURING METHOD THEREOF

(75) Inventors: Tsunenori Suzuki, Kanagawa (JP); Ryoji Nomura, Kanagawa (JP); Mikio Yukawa, Kanagawa (JP); Nobuharu Ohsawa, Kanagawa (JP); Tamae Takano, Kanagawa (JP); Yoshinobu Asami, Kanagawa (JP); Takehisa Sato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 354 days.

(21) Appl. No.: 11/510,420

(22) Filed: Aug. 25, 2006

(65) Prior Publication Data

US 2007/0045621 A1    Mar. 1, 2007

(30) Foreign Application Priority Data

Aug. 31, 2005    (JP)    ............................. 2005-252881

(51) Int. Cl.
    *H01L 21/30* (2006.01)
(52) U.S. Cl. ............... 438/458; 438/149; 257/E21.6
(58) Field of Classification Search ............... 438/15, 438/25, 118, 616, 149, 151, 458, 464, 780, 438/787
See application file for complete search history.

(56) References Cited

U.S. PATENT DOCUMENTS

| | | | |
|---|---|---|---|
| 5,621,246 A | 4/1997 | Motoyama | |
| 6,885,389 B2 * | 4/2005 | Inoue et al. | 346/45 |
| 6,947,321 B2 | 9/2005 | Tanabe | |
| 2003/0032210 A1 | 2/2003 | Takayama et al. | |
| 2003/0222575 A1 | 12/2003 | Yamazaki et al. | |
| 2004/0087110 A1 | 5/2004 | Takayama et al. | |
| 2004/0232413 A1 | 11/2004 | Yamazaki et al. | |
| 2006/0044232 A1 * | 3/2006 | Choi et al. | 345/76 |

FOREIGN PATENT DOCUMENTS

| | | |
|---|---|---|
| EP | 1381054 A1 | 1/2004 |
| JP | 07-030012 | 1/1995 |
| JP | 2003-174153 | 6/2003 |
| JP | 2004-047791 | 2/2004 |

\* cited by examiner

*Primary Examiner*—Quoc D Hoang
(74) *Attorney, Agent, or Firm*—Cook Alex Ltd.

(57) ABSTRACT

It is an object of the present invention to manufacture, with high yield, semiconductor devices in each of which an element which has a layer containing an organic compound is provided over a flexible substrate. A method for manufacturing a semiconductor device includes: forming a separation layer over a substrate; forming an element-forming layer by forming an inorganic compound layer, a first conductive layer, and a layer containing an organic compound over the separation layer, and forming a second conductive layer which is in contact with the layer containing an organic compound and the inorganic compound layer; and after attaching a first flexible substrate over the second conductive layer, separating the separation layer and the element-forming layer at the separation layer.

20 Claims, 23 Drawing Sheets

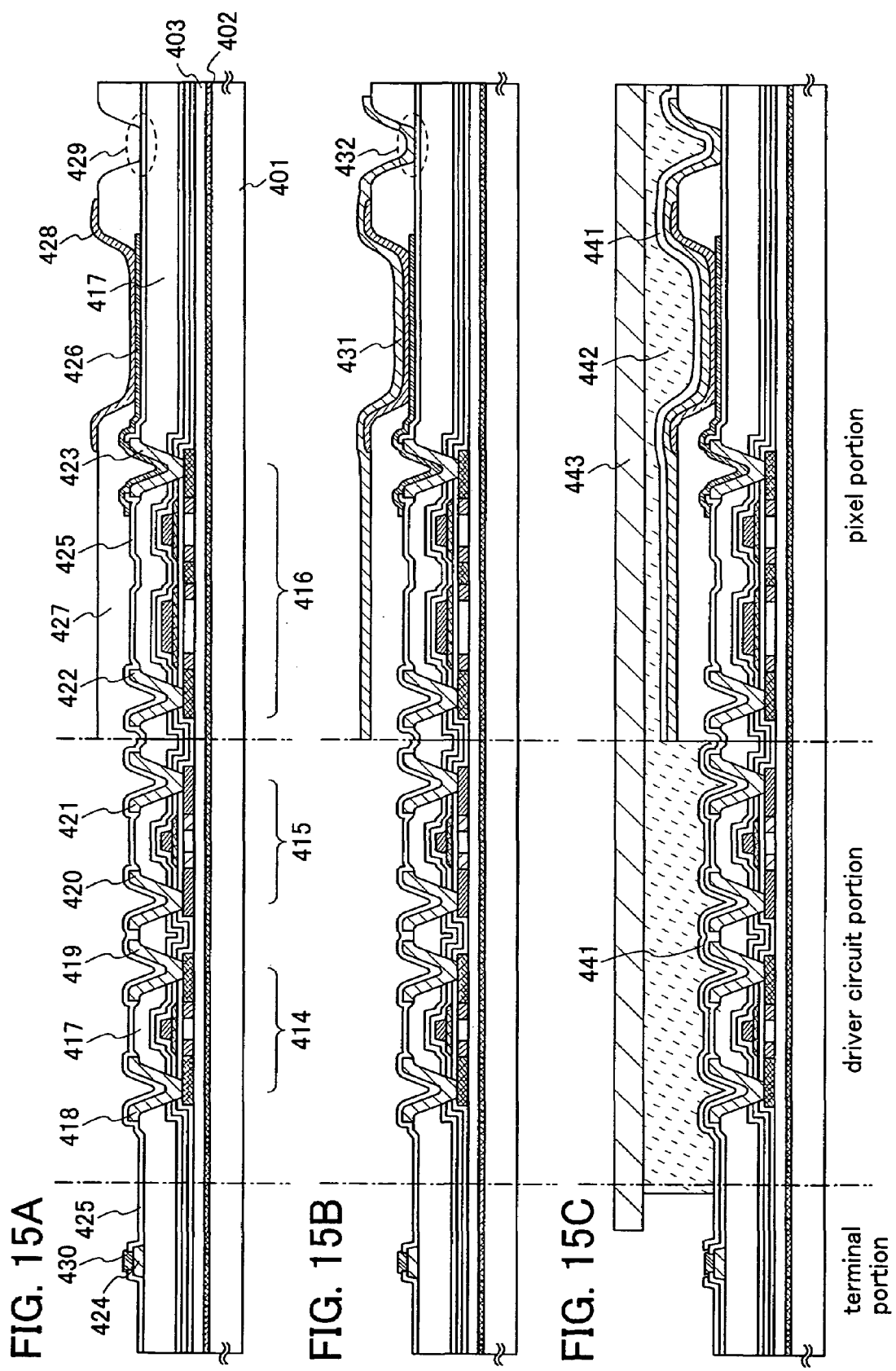

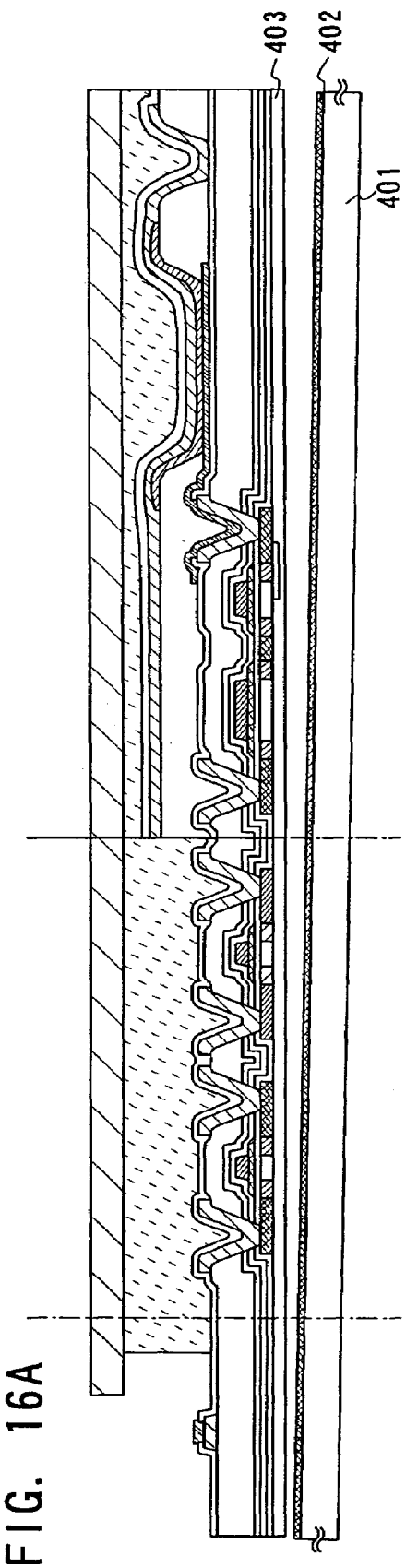
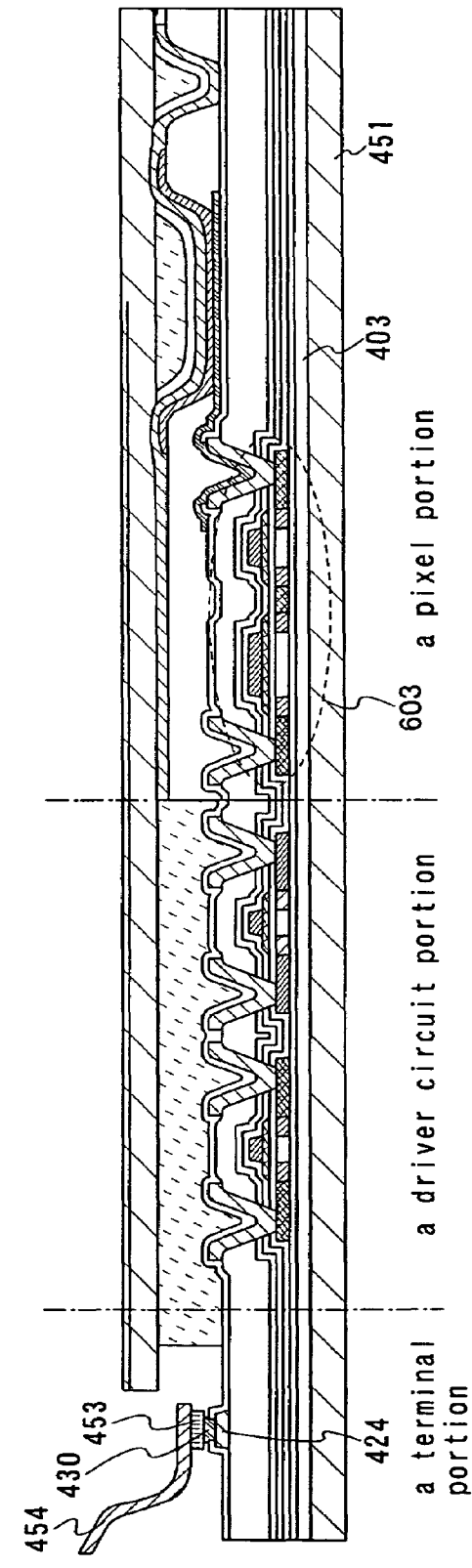
FIG. 16A
FIG. 16B

SEMICONDUCTOR DEVICE AND MANUFACTURING METHOD THEREOF

BACKGROUND OF THE INVENTION

1. Field of Invention

The present invention relates to a semiconductor device provided with an element which has a layer containing an organic compound over a flexible substrate, and also relates to a manufacturing method of the semiconductor device.

2. Description of the Related Art

In recent years, development has been advanced on semiconductor devices which have various functions by integrating a plurality of circuits over insulating surfaces. Moreover, development has also been advanced on semiconductor devices which can send and receive data wirelessly by providing antennas. Such semiconductor devices are referred to as wireless chips (also referred to as ID tags, IC tags, IC chips, RF (Radio Frequency) tags, wireless tags, electronic tags, or RFID (Radio Frequency Identification) tags) and have been already introduced into some markets.

Many of these semiconductor devices which have been put into practical use have circuits using semiconductor substrates made of Si or the like (such circuits are also referred to as IC (Integrated Circuit) chips) and antennas, and the IC chip includes a storage circuit (also referred to as a memory), a control circuit, and the like. In particular, by providing a storage circuit capable of storing a large amount of data, a higher-value-added semiconductor device with improved performance can be provided.

It has been required to manufacture these semiconductor devices at low cost, and development has been extensively carried out recently on elements such as transistors, memories, and solar cells using layers containing organic compounds for control circuits, storage circuits, or the like (see, for example, Reference 1: Japanese Patent Laid-Open No. 2004-47791).

Various applications of such semiconductor devices are expected, and usage of flexible plastic films is attempted in pursuit of reduction in size and weight.

Since plastic films have low heat resistance, it is necessary to decrease the highest temperature in a process. Therefore, TFTs cannot be formed using a plastic film to have as favorable electrical characteristics as those formed over a glass substrate.

Consequently, such a technique is suggested that elements formed over a glass substrate are separated from the substrate and attached to another base material such as a plastic film (see Reference 2: Japanese Patent Laid-Open No. 2003-174153).

However, in the case of separating an element which has a layer containing an organic compound by using a separation step shown in Reference 2; specifically, in the case of forming a separation layer 102 over a substrate 101, forming an insulating layer 103 over the separation layer 102, forming a thin film transistor 1111 over the insulating layer 103, forming a first electrode layer 104 to be connected to the thin film transistor 1111, forming an organic insulating layer 1161 covering an end portion of the first electrode layer 104, forming a layer 105 containing an organic compound over the organic insulating layer 1161, and forming a second electrode layer 1162 over the layer 105 containing an organic compound and the organic insulating layer 1161, to separate an element 151 which has the layer containing an organic compound and a layer 1163 having the element 151 as shown in FIG. 23, there is a problem in that the separation occurs between the layer 105 containing an organic compound and the second electrode layer 1162. As a result, it is difficult to manufacture, with high yield, semiconductor devices in each of which the element which has the layer containing an organic compound is provided over a plastic substrate.

This is because the adhesion between the layer 105 containing an organic compound and the second electrode layer 106 is low. In specific, since polyimide, an epoxy resin, an acrylic resin, or the like that forms the organic insulating layer has a polar substituent such as an imide group, a cyano group, or a hydroxy group, the adhesion between the organic insulating layer and a layer formed with an inorganic compound, herein a gate insulating film or a first conductive layer, is high. However, since the layer 105 containing an organic compound functions as a semiconductor, the layer 105 containing an organic compound is formed by using a material having a carrier-transporting property. The material having a carrier-transporting property does not have a polar substituent in general. Accordingly, the adhesion between the layer 105 containing an organic compound and the second electrode layer 106 is so low that separation occurs between the layer 105 containing an organic compound and the second electrode layer 106 in a separation step.

SUMMARY OF THE INVENTION

In view of the above problem, it is an object of the present invention to manufacture, with high yield, semiconductor devices in each of which an element which has a layer containing an organic compound is provided over a flexible substrate.

According to the present invention, a region having the layer 105 containing an organic compound and the second electrode layer 106 between which adhesion is low is formed over a substrate having a separation layer and a region having the inorganic compound layer and the second electrode layer 106 between which adhesion is high is formed so as to surround an outer edge of the region having the layer 105 containing an organic compound and the second electrode layer 106 between which adhesion is low, when viewed from above. In a cross section of the region having the layer 105 containing an organic compound and the second electrode layer 106 between which adhesion is low, for example, an inorganic compound layer is in contact with a layer containing an organic compound not having a polar substituent such as an imide group, a cyano group, or a hydroxyl group; on the other hand, in a cross section of the region having the inorganic compound layer and the second electrode layer 106 between which adhesion is high, a plurality of inorganic compound layers are in contact with each other. A region 503 having the inorganic compound layer and the second electrode layer 106 between which adhesion is high may surround an outer edge of a region 502 having the layer 105 containing an organic compound and the second electrode layer 106 between which adhesion is low as exemplified in FIG. 22A. Moreover, as FIG. 22B shows an example, the region 503 having the inorganic compound layer and the second electrode layer 106 between which adhesion is high may be discontinuously formed so as to surround the outer edge of the region 502 having the layer 105 containing an organic compound and the second electrode layer 106 between which adhesion is low. Moreover, as FIG. 22C shows an example, the region 503 having the inorganic compound layer and the second electrode layer 106 between which adhesion is high with a rectangular shape may be formed in accordance with each side of the region 502 having the layer 105 containing an organic compound and the second electrode layer 106 between which adhesion is low. The region having the inorganic compound layer and the second electrode layer 106 between which adhesion is high can have various shapes such as a rectangular shape, a circular shape, an elliptical shape, a curved shape, or the like.

Moreover, according to the present invention, after forming an element-forming layer in which the region 502 having the layer 105 containing an organic compound and the second electrode layer 106 between which adhesion is low is formed over a substrate having a separation layer 501 and the region 503 having the inorganic compound layer and the second electrode layer 106 between which adhesion is high is formed so as to surround the outer edge of the region 502, the substrate and the element-forming layer are separated from each other at the separation layer, and then the element-forming layer is attached to a flexible substrate.

According to the present invention, a method for manufacturing a semiconductor device includes: forming a separation layer over a substrate; forming an element-forming layer by forming an inorganic compound layer, a first conductive layer, and a layer containing an organic compound over the separation layer, and forming a second conductive layer that is in contact with the layer containing an organic compound and the inorganic compound layer; and after attaching a first flexible substrate over the second conductive layer, separating the substrate and the element-forming layer from each other at the separation layer.

According to the present invention, a semiconductor device includes a flexible substrate, an inorganic compound layer, a layer containing an organic compound, and a conductive layer which is in contact with the layer containing an organic compound and the inorganic compound layer.

The inorganic compound layer is an insulating layer or a conductive layer. The inorganic compound layer can be replaced by a metal layer. Moreover, the inorganic compound layer may function as a gate insulating layer, an interlayer insulating layer, or a connection layer.

The layer containing an organic compound and the conductive layer which is in contact with the layer containing an organic compound form parts of a storage element or a light-emitting element.

Moreover, the present invention includes the following.

According to the present invention, a method for manufacturing a semiconductor device includes: forming a separation layer over a substrate; forming an element-forming layer by forming an inorganic compound layer, a semiconductor element, and a first electrode layer to be connected to the semiconductor element over the separation layer, forming a layer containing an organic compound over the first electrode layer, and forming a second electrode layer which is in contact with the layer containing an organic compound and the inorganic compound layer; and after attaching a first flexible substrate over the second electrode layer, separating the substrate and the element-forming layer from each other at the separation layer.

In the case where the semiconductor element is a thin film transistor, the inorganic compound layer is any of the following layers: an insulating layer for insulating a gate electrode and a wire of the thin film transistor; a gate insulating layer for insulating a gate electrode and a semiconductor layer of the thin film transistor; a layer which is formed with the same material as a gate electrode of the thin film transistor and which is the same as the gate electrode of the thin film transistor; a layer which is formed with the same material as a wire of the thin film transistor and which is in contact with a layer that is the same as the wire of the thin film transistor; and a layer which is formed with the same material as the first electrode layer and which is in contact with a layer that is in contact with the first electrode layer.

According to the present invention, a method for manufacturing a semiconductor device includes: forming a separation layer over a substrate; forming an element-forming layer by forming a thin film transistor over the separation layer, forming a first electrode layer to be connected to the thin film transistor, forming an inorganic insulating layer which covers an end portion of the first electrode layer, forming a layer containing an organic compound over a part of the inorganic insulating layer and an exposed portion of the first electrode layer, and forming a second electrode layer which is in contact with the layer containing an organic compound and the inorganic insulating layer; and after attaching a first flexible substrate over the second electrode layer, separating the substrate and the element-forming layer from each other at the separation layer.

According to the present invention, a method for manufacturing a semiconductor device includes: forming a separation layer over a substrate; forming an element-forming layer by forming a thin film transistor over the separation layer, forming an inorganic insulating layer for insulating a gate electrode and a wire of the thin film transistor, forming a first electrode layer to be connected to the wire of the thin film transistor over the inorganic insulating layer, forming an organic insulating layer which covers an end portion of the first electrode layer, forming a layer containing an organic compound over a part of the organic insulating layer and an exposed portion of the first electrode layer, and forming a second electrode layer which is in contact with the layer containing an organic compound and the inorganic insulating layer; and after attaching a first flexible substrate over the second electrode layer, separating the substrate and the element-forming layer from each other at the separation layer.

According to the present invention, a method for manufacturing a semiconductor device includes: forming a separation layer over a substrate; forming an element-forming layer by forming a semiconductor layer over the separation layer, forming a gate insulating layer by an inorganic insulator over the semiconductor layer, forming a gate electrode over the gate insulating layer, forming a first organic insulating layer over the gate electrode, partially exposing the semiconductor layer and the gate insulating layer by partially removing the first organic insulating layer, forming a wire to be connected to the semiconductor layer over the first organic insulating layer, forming a first electrode layer to be connected to the wire, forming a second organic insulating layer which covers an end portion of the first electrode layer, forming a layer containing an organic compound over a part of the second organic insulating layer and an exposed portion of the first electrode layer, and forming a second electrode layer which is in contact with the layer containing an organic compound and the gate insulating layer; and after attaching a first flexible substrate over the second electrode layer, separating the substrate from the element-forming layer from each other at the separation layer.

According to the present invention, a method for manufacturing a semiconductor device includes: forming a separation layer over a substrate; forming an element-forming layer by forming an insulating layer over the separation layer, forming a semiconductor layer over the insulating layer, forming a gate insulating layer by an inorganic insulator over the semiconductor layer, forming a gate electrode and a first conductive layer over the gate insulating layer, forming an organic insulating layer over the gate electrode and the first conductive layer, partially exposing the semiconductor layer and the first conductive layer by selectively removing the organic insulating layer, forming, over the organic insulating layer, a wire to be connected to the semiconductor layer as well as a second conductive layer to be connected to the first conductive layer, forming a first electrode layer to be connected to the wire as well as a third conductive layer to be connected to the second conductive layer, forming an organic insulating layer which covers end portions of the first electrode layer and the third conductive layer, forming a layer containing an organic compound over a part of the organic insulating layer and an exposed portion of the first electrode layer, and forming a second electrode layer which is in contact with the layer containing an organic compound and at least one of the first to third conductive layers; and after attaching a first flexible substrate over the second conductive layer, separating the substrate and the element-forming layer from each other at the separation layer.

After separating the element-forming layer and the separation layer from each other, the element-forming layer may be attached to a second flexible substrate.

According to the present invention, a semiconductor device includes an insulating layer formed over a first flexible substrate, a thin film transistor formed over the insulating layer, a first electrode layer to be connected to the thin film transistor, an inorganic insulating layer covering an end portion of the first electrode layer, a layer containing an organic compound formed over the first electrode layer, a second electrode layer which is in contact with the layer containing an organic compound and the inorganic insulating layer, and a second flexible substrate formed over the second electrode layer.

According to the present invention, a semiconductor device includes an insulating layer formed over a first flexible substrate; a thin film transistor formed over the insulating layer; an inorganic insulating layer for insulating a gate electrode from a wire of the thin film transistor; a first electrode layer which is formed over the inorganic insulating layer and which is to be connected to the thin film transistor; an organic insulating layer covering an end portion of the first electrode layer; a layer containing an organic compound formed over the first electrode layer; a second electrode layer which is in contact with the layer containing an organic compound, the organic insulating layer, and the inorganic insulating layer; and a second flexible substrate formed over the second electrode layer.

According to the present invention, a semiconductor device includes an insulating layer formed over a first flexible substrate; a thin film transistor formed over the insulating layer; a gate insulating layer formed by an inorganic insulator for insulating a gate electrode from a semiconductor layer of the thin film transistor; a first organic insulating layer which is formed over a part of the gate insulating layer and which insulates the gate electrode from a wire of the thin film transistor; a first electrode layer which is formed over the first organic insulating layer and which is to be connected to the thin film transistor; a second organic insulating layer which covers an end portion of the first electrode layer and which is formed over the first organic insulating layer; a layer containing an organic compound formed over the first electrode layer; a second electrode layer which is in contact with the layer containing an organic compound, the second organic insulating layer, and the inorganic insulating layer; and a second flexible substrate formed over the second electrode layer.

According to the present invention, a semiconductor device includes an insulating layer formed over a first flexible substrate, a thin film transistor formed over the insulating layer, a first conductive layer formed by to the same layer as a gate electrode of the thin film transistor, a first organic insulating layer which covers a gate electrode of the thin film transistor, a wire formed over the first organic insulating layer, a second conductive layer which is formed by the same layer as the wire and which is in contact with the first conductive layer, a first electrode layer which is formed over the first organic insulating layer and which is to be connected to the wire of the thin film transistor, a third conductive layer which is formed by the same layer as the first electrode layer and which is in contact with the second conductive layer, a second organic insulating layer covering an end portion of the first electrode layer, a layer containing an organic compound formed over the second organic insulating layer and the first electrode layer, a second electrode layer which is in contact with the layer containing an organic compound and the third conductive layer, and a second flexible substrate formed over the second electrode layer.

The first electrode layer, the layer containing an organic compound, and the second electrode layer may form parts of a storage element or a light-emitting element.

In the present invention, since the adhesion between the inorganic compound layer and the conductive layer is higher than that between the layer containing an organic compound and the conductive layer, separation is difficult to occur at an interface between the inorganic compound layer and the conductive layer in a separation step. Therefore, by forming a region having low adhesion and a region having high adhesion so as to surround an outer edge of the region having low adhesion when viewed from above, separation at an interface between the conductive layer and the layer containing an organic compound can be prevented. Moreover, a layer having a storage element or a light-emitting element formed over a substrate can be separated with high yield. Further, a semiconductor device provided with an element which has a layer containing an organic compound over a flexible substrate can be manufactured with high yield.

In a semiconductor device of the present invention, a layer containing an organic compound and an organic insulating layer are sandwiched between an inorganic compound layer and a conductive layer, and moreover, the semiconductor device has a number of regions where the inorganic compound layer and the conductive layer are in contact with each other. Thus, regions where the layer containing an organic compound and the organic insulating layer are exposed to the air decrease and moisture, oxygen, and the like are unlikely to intrude such regions. This makes it possible to suppress deterioration of the semiconductor device.

Since a semiconductor device provided with an element which has a layer containing an organic compound over a flexible substrate can be obtained, the semiconductor device can be more lightweight and thinner.

BRIEF DESCRIPTION OF THE DRAWINGS

In the accompanying drawings:

FIGS. 15A to 15C are cross-sectional views showing manufacturing steps of a semiconductor device of the present invention;

FIGS. 16A and 16B are cross-sectional views showing manufacturing steps of a semiconductor device of the present invention;

DETAILED DESCRIPTION OF THE INVENTION

Embodiment Modes

Figure 1A:
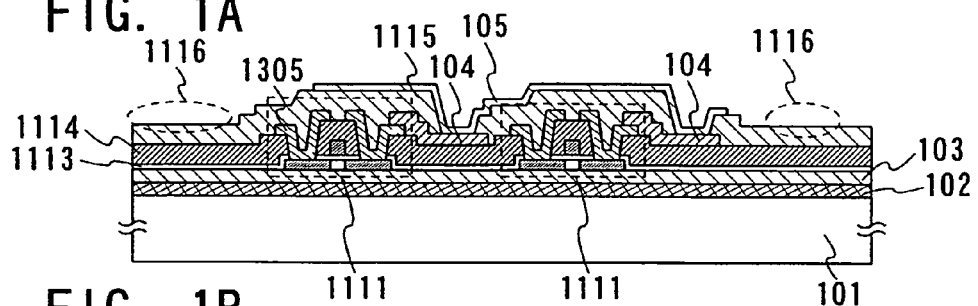
FIGS. 1A to 1E are cross-sectional views showing manufacturing steps of a semiconductor device of the present invention.

Embodiment modes and embodiments of the present invention will hereinafter be described with reference to drawings. However, the present invention is not restricted to the following description, and it is easily understood by those skilled in the art that the mode and detail can be variously changed without departing from the scope and spirit of the present invention. Therefore, the present invention is not restricted to the description of the embodiment modes and embodiments hereinafter shown. It is to be noted that, in the structure of the present invention hereinafter described, the reference numeral indicating the same part is used in common throughout the drawings.

Embodiment Mode 1

With reference to FIGS. 1A to 1E, this embodiment mode will describe a method for separating, with high yield, an element which has a layer containing an organic compound and an element-forming layer having the element.

As shown in FIG. 1A, a separation layer 102 is formed over a substrate 101, and an insulating layer 103 is formed over the separation layer 102. Next, a semiconductor element is formed over the insulating layer 103. Here, a thin film transistor 1111 is formed as the semiconductor element. Then, a first electrode layer 104 which is to be connected to a wire 1305 of the thin film transistor 1111 is formed, and an inorganic insulating layer 1115 covering an end portion of the first electrode layer 104 is formed. A layer 105 containing an organic compound is formed over the first electrode layer 104 and the inorganic insulating layer 1115 by an evaporation method. In FIG. 1A, a region 1116 is a region where the inorganic insulating layer 1115 is exposed. The layer 105 containing an organic compound is formed by using a metal mask so that the inorganic insulating layer 1115 is partially exposed. Alternatively, after forming the layer 105 containing an organic compound over the first electrode layer and the inorganic insulating layer 1115, the layer 105 is partially etched to partially expose the inorganic insulating layer 1115.

As the substrate 101, a glass substrate, a quartz substrate, a metal or stainless steel substrate with an insulating layer formed over one surface, a plastic substrate having heat resistance enough to resist processing temperature of the steps, or the like is used. Since the substrates aforementioned as the substrate 101 are not restricted in size and shape, for example, a rectangular substrate with a length of 1 m or more on a side can be used as the substrate 101. With such a rectangular substrate, productivity can be drastically increased. This is a superior point to a circular silicon substrate.

The separation layer 102 is formed in a single layer or multilayer structure with an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); an alloy material containing the element as its main component; or a compound material containing the element as its main component by a sputtering method, a plasma CVD method, a coating method, a printing method, or the like. A crystal structure of a layer containing silicon may be amorphous, microcrystal, or polycrystal. Here, a coating method means a method by which a solution is discharged on an object to form a film, and includes, for example, a spin coating method and a droplet discharging method. A droplet discharging method is a method of forming a predetermined pattern by discharging a droplet including a composition containing particulates from a small hole.

If the separation layer 102 has a single-layer structure, the separation layer 102 is preferably formed by using a layer containing tungsten, molybdenum, or a mixture of tungsten and molybdenum. Alternatively, a layer containing tungsten oxide or tungsten oxynitride, a layer containing molybdenum oxide or molybdenum oxynitride, or a layer containing an oxide or oxynitride of a mixture of tungsten and molybdenum may be formed. A mixture of tungsten and molybdenum corresponds to, for example, an alloy of tungsten and molybdenum.

If the separation layer 102 has a multilayer structure, a layer containing tungsten, molybdenum, or a mixture of tungsten and molybdenum may be formed as a first layer, and a layer containing an oxide of tungsten, molybdenum or a mixture of tungsten and molybdenum; a nitride of tungsten, molybdenum or a mixture of tungsten and molybdenum; an oxynitride of tungsten, molybdenum or a mixture of tungsten and molybdenum; or a nitride oxide of tungsten, molybdenum or a mixture of tungsten and molybdenum may be formed as a second layer.

If the separation layer 102 has a multilayer structure of a layer containing tungsten and a layer containing tungsten oxide, the layer containing tungsten may be formed and then an insulating layer formed with an oxide may be formed over the layer containing tungsten, thereby forming a layer containing tungsten oxide at an interface between the layer containing tungsten and the insulating layer. Moreover, a surface of the layer containing tungsten may be subjected to a treatment such as a thermal oxidation treatment, an oxygen plasma treatment, or a treatment using a solution having strong oxidizability such as ozone water, thereby forming the layer containing tungsten oxide. This similarly applies to the case of forming a layer containing tungsten nitride, tungsten oxynitride, or tungsten nitride oxide, and after forming a layer containing tungsten, a silicon nitride layer, a silicon oxynitride layer, and/or a silicon nitride oxide layer may be formed over the layer containing tungsten.

Tungsten oxide is represented by $WO_x$ where x ranges from 2 to 3. X may be 2 ($WO_2$), 2.5 ($W_2O_5$), 2.75 ($W_4O_{11}$), 3 ($WO_3$), or the like.

Although the separation layer 102 is formed so as to be in contact with the substrate 101 in the above step, the present invention is not restricted to this step. An insulating layer to be a base may be formed so as to be in contact with the substrate 101 and then the separation layer 102 may be provided so as to be in contact with the insulating layer.

The insulating layer 103 may be formed with an inorganic compound in a single-layer or multilayer structure by a sputtering method, a plasma CVD method, a coating method, a printing method, or the like. As a typical example of the inorganic compound, oxidized silicon or nitrided silicon is given. As a typical example of oxidized silicon, silicon oxide, silicon oxynitride, silicon nitride oxide, or the like is given. As a typical example of nitrided silicon, silicon nitride, silicon oxynitride, silicon nitride oxide, or the like is given.

Moreover, the insulating layer 103 may have a multilayer structure. For example, layers may be stacked using an inorganic compound. Typically, the insulating layer 103 may be formed by stacking silicon oxide, silicon nitride oxide, and silicon oxynitride.

Figure 21A:
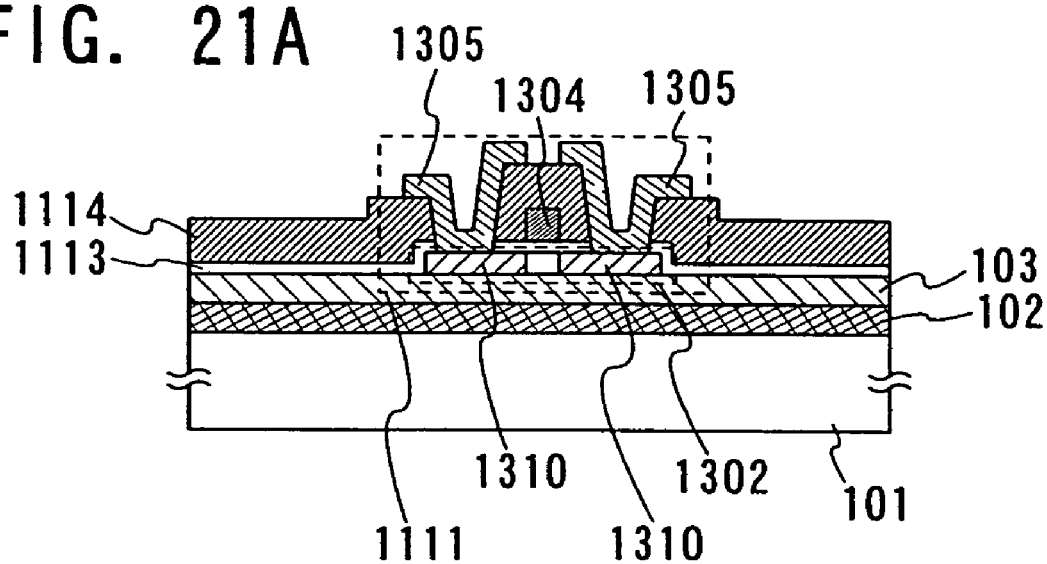
FIGS. 21A and 21B are cross-sectional views showing structures of a thin film transistor applicable to the present invention.

An aspect of the thin film transistor 1111 is described with reference to FIGS. 21A and 21B. FIG. 21A shows an example of a top-gate thin film transistor. The separation layer 102 and the insulating layer 103 are provided over the substrate 101, and the thin film transistor 1111 is provided over the insulating layer 103. As for the thin film transistor 1111, a semiconductor layer 1302 and a gate insulating layer 1113 formed by an inorganic insulator are provided over the insulating layer 103. A gate electrode 1304 is formed over the gate insulating layer 1113 in accordance with the semiconductor layer 1302, and an insulating layer (not shown) functioning as a protective layer and an inorganic insulating layer 1114 functioning as an interlayer insulating layer are provided over the gate electrode 1304. Moreover, the wires 1305 which are connected to source and drain regions 1310 of the semiconductor layer are formed. Over the wires 1305, an insulating layer functioning as a protective layer may be formed.

The semiconductor layer 1302 is a layer formed with a semiconductor having a crystal structure. A non-single crystal semiconductor or a single crystal semiconductor can be used. In particular, it is preferable to apply a crystalline semiconductor which is crystallized by a heat treatment or a crystalline semiconductor which is crystallized by combining a heat treatment and laser irradiation. In the heat treatment, a crystallization method using a metal element which promotes crystallization of a silicon semiconductor, such as nickel can be applied. Moreover, a metal oxide can be formed by oxidizing a surface of the separation layer 102 at an interface between the separation layer 102 and the insulating layer 103 by heating in the crystallization step of a silicon semiconductor. By forming the metal oxide, separation can be carried out easily between the separation layer 102 and the insulating layer 103 in a later separation step.

In the case of crystallization by laser irradiation in addition to the heat treatment, the crystallization can be carried out by using a continuous wave laser beam or a pulsed laser beam with a repetition rate of 10 MHz or higher and a pulse width of 1 ns or shorter, preferably 1 to 100 ps, in such a way that a melt zone in which the crystalline semiconductor is melted is moved continuously in a direction where the laser beam is moved. By this crystallization method, a crystalline semiconductor in which crystal grain boundaries extend in one direction and grain diameter is large can be obtained. By matching a carrier drifting direction to the direction where the crystal grain boundaries extend, the electric field effect mobility of the transistor can be increased. For example, a mobility of 400 $cm^2/V \cdot sec$ or higher can be achieved.

In the case of applying the above crystallization step to a crystallization process at or below the upper temperature limit of a glass substrate (about 600° C.), a large glass substrate can be used. Therefore, it is possible to manufacture a large number of semiconductor devices per substrate, thereby allowing cost reduction.

The semiconductor layer 1302 may be formed by a crystallization step through a heat treatment at or above the upper temperature limit of a glass substrate. Typically, a quartz substrate is used as the substrate 101 having an insulating surface, and an amorphous or microcrystalline semiconductor is heated at 700° C. or higher to form the semiconductor layer 1302. As a result, a semiconductor with superior crystallinity can be formed. Thus, a thin film transistor which has favorable characteristics such as high response speed and high mobility and which can operate at high speed can be provided.

The gate electrode 1304 can be formed with a metal or a polycrystalline semiconductor doped with an impurity imparting one conductivity type. In the case of using a metal, tungsten (W), molybdenum (Mo), titanium (Ti), tantalum (Ta), aluminum (Al), or the like can be used. Moreover, a metal nitride obtained by nitriding a metal can be used. Alternatively, a first layer including the metal nitride and a second layer including the metal may be stacked. In the case of a multilayer structure, such a shape is applicable that an end portion of the first layer sticks out to the outside farther than an end portion of the second layer. By forming the first layer with a metal nitride, the first layer can be barrier metal. In other words, the metal of the second layer can be prevented from diffusing to the gate insulating layer 1113 or the semiconductor layer 1302 thereunder.

To the thin film transistor which is formed by combining the semiconductor layer 1302, the gate insulating layer 1113, the gate electrode 1304, and the like, various structures such as a single-drain structure, an LDD (Lightly-Doped Drain) structure, and a gate-overlapped drain structure can be applied. Here, a thin film transistor having a single-drain structure is described. Moreover, a multi-gate structure where transistors to which gate voltages having the same potential equally are applied are serially connected, or a dual-gate structure where gate electrodes sandwich a semiconductor layer on its upper and lower sides can be applied.

In this embodiment mode, the inorganic insulating layer 1114 is formed by an inorganic insulator such as silicon oxide or silicon oxynitride.

The wires 1305 formed over the inorganic insulating layer 1114 can be provided so as to intersect with wires formed by the same layer as the gate electrode 1304, and a multiwire structure may be formed. By stacking a plurality of insulating layers each having a similar function to the inorganic insulating layer 1114 and forming wires over the plurality of insulating layers, a multiwire structure can be formed. The wires 1305 are preferably formed with a combination of a low resistant material like aluminum (Al) and barrier metal using a metal material having a high melting point such as titanium (Ti) or molybdenum (Mo); for example, the wires 1305 are formed in a multilayer structure including titanium (Ti) and aluminum (Al), a multilayer structure including molybdenum (Mo) and aluminum (Al), or the like.

Figure 21B:
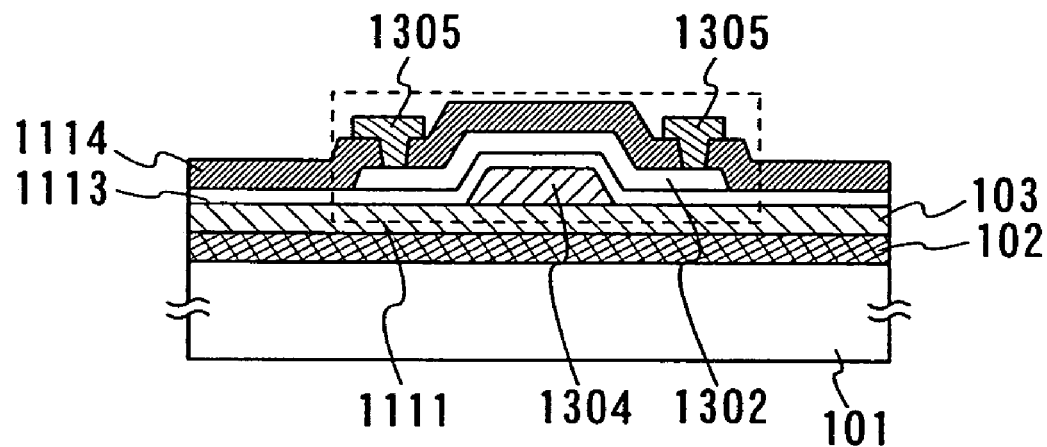
Figure 22A:
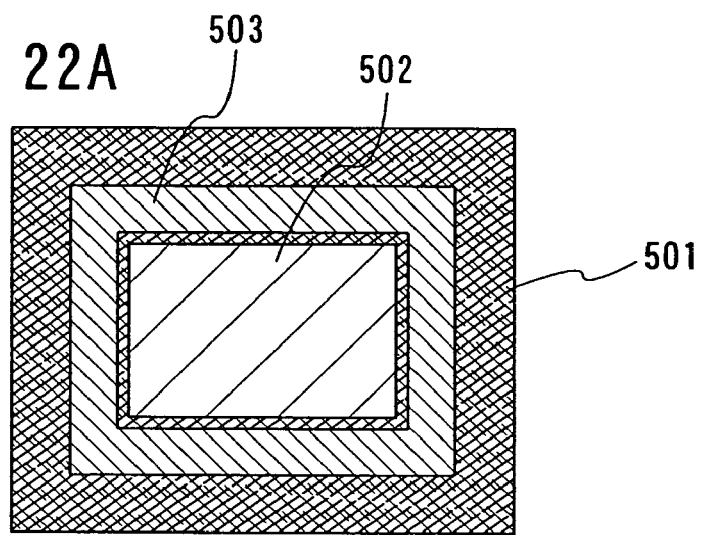
FIGS. 22A to 22C are top views showing semiconductor devices of the present invention.
Figure 22B:
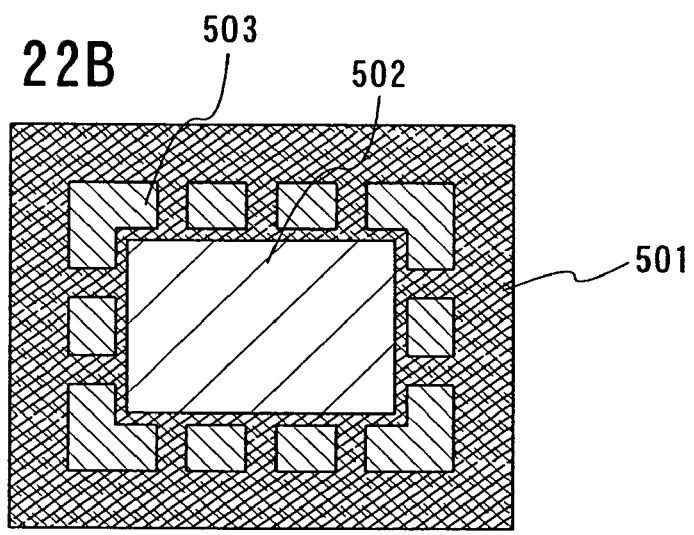
Figure 22C:
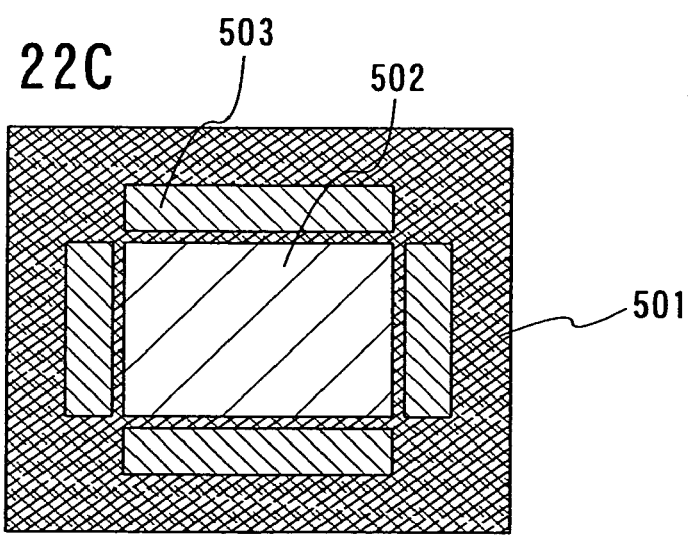
Figure 23:
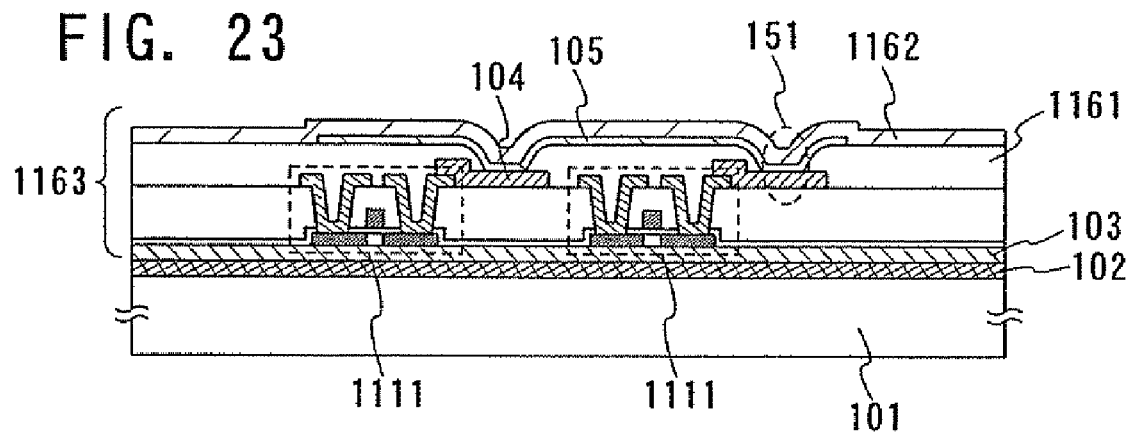
FIG. 23 is a cross-sectional view showing a conventional semiconductor device.

FIG. 21B shows an example of applying a bottom-gate thin film transistor. The separation layer 102 and the insulating layer 103 are formed over the substrate 101, and the thin film transistor 1111 is provided thereover. In the thin film transistor 1111, the gate electrode 1304, the gate insulating layer 1113, the semiconductor layer 1302, and the inorganic insulating layer 1114 functioning as an interlayer insulating layer are provided. Moreover, an insulating layer functioning as a protective layer may be formed thereover. The wires 1305 which are in contact with the source and drain regions of the semiconductor layer 1302 can be formed over the inorganic insulating layer 1114.

Furthermore, the thin film transistor 1111 may be replaced by any semiconductor element with any structure as long as the semiconductor element can function as a switching element. As a typical example of the switching element, an MIM (Metal-Insulator-Metal), a diode, or the like is given.

In FIG. 1A, the first electrode layer 104 can be formed in a single-layer or multilayer structure by using a metal, alloy, compound, or the like having high conductivity by a sputtering method, a plasma CVD method, a coating method, a printing method, an electrolytic plating method, an electroless plating method, or the like. Typically, a metal, alloy, conductive compound, mixture thereof, or the like having a high work function (specifically 4.0 eV or higher) can be used. Moreover, a metal, alloy, conductive compound, mixture thereof, or the like having a low work function (specifically 3.8 eV or lower) can be used.

As a typical example of a metal, alloy, or conductive compound having a high work function (specifically 4.0 eV or higher), indium tin oxide (hereinafter called ITO), indium tin oxide containing silicon, indium oxide containing 2 to 20 atomic % of zinc oxide (ZnO), or the like is given. Moreover, titanium (Ti), gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride (TiN), tungsten nitride (WN), or molybdenum nitride (MoN)), or the like can be used.

As a typical example of a metal, alloy, or conductive compound having a low work function (specifically 3.8 eV or lower), a metal belonging to Group 1 or 2 in the periodic table of the elements, i.e., an alkali metal such as lithium (Li) or cesium (Cs), or an alkaline earth metal such as magnesium (Mg), calcium (Ca), or strontium (Sr); aluminum (Al); an alloy containing any of these (such as MgAg or AlLi); a rare earth metal such as europium (Er) or ytterbium (Yb); an alloy containing a rare earth metal; or the like can be used.

If an electrode for injecting holes to the layer containing an organic compound, i.e., an anode is used for the first electrode layer 104 or the second electrode layer 106, it is preferable to use a material having a high work function. On the contrary, if an electrode for injecting electrons to the layer containing an organic compound, i.e., a cathode is used, it is preferable to use a material having a low work function.

The inorganic insulating layer 1115 is formed by an inorganic insulator such as silicon oxide, silicon nitride, silicon oxynitride, or aluminum nitride by a thin-film forming method such as a CVD method or a sputtering method. Here, after forming an insulating film by a thin-film forming method, the insulating film is selectively etched so as to partially expose the first electrode layer 104, thereby forming the inorganic insulating layer 1115.

The layer 105 containing an organic compound can be formed by an evaporation method, an electron beam evaporation method, a coating method, or the like. In the case of using the aforementioned manufacturing method to form the layer containing an organic compound, the layer 105 containing an organic compound is formed while forming the region 1116 for partially exposing the inorganic insulating layer 1115. Alternatively, after forming a layer containing an organic compound over the inorganic insulating layer 1115 and the first electrode layer 104, the layer containing an organic compound may be selectively etched to form the region 1116 for partially exposing the inorganic insulating layer 1115.

Here, after forming a titanium film of 50 to 200 nm thick by a sputtering method, the titanium film is etched into a desired shape by a photolithography method, thereby forming the first electrode layer 104. Next, the layer containing an organic compound is formed with NPB by an evaporation method.

Figure 1B:
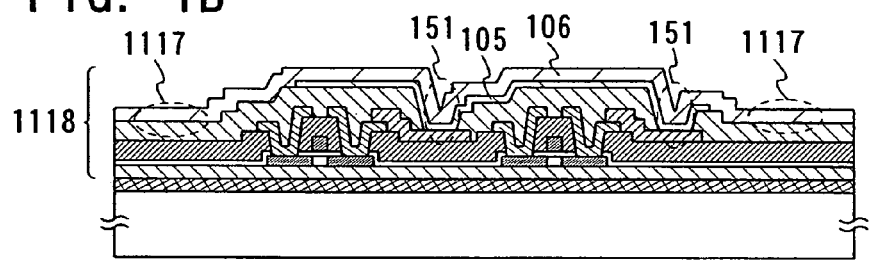

Next, as shown in FIG. 1B, the second electrode layer 106 is formed over the inorganic insulating layer 1115 and the layer 105 containing an organic compound. Accordingly, a region 1117 where the inorganic insulating layer 1115 is in contact with the second electrode layer 106 can be formed. Moreover, by the first electrode layer 104, the layer 105 containing an organic compound, and the second electrode layer 106, an element 151 which has the layer containing an organic compound can be formed. The second electrode layer 106 can be formed by an evaporation method, a sputtering method, a CVD method, a printing method, a coating method, or the like. The second electrode layer 106 may be formed with a similar material to the first electrode layer 104. If the first electrode layer 104 is formed with a material having a high work function, the second electrode layer 106 is preferably formed with a material having a low work function. If the first electrode layer 104 is formed with a material having a low work function, the second electrode layer 106 is preferably formed with a material having a high work function.

Here, the second electrode layer 106 is formed by evaporating aluminum by an evaporation method.

It is to be noted here that a stack containing the insulating layer 103 through the second electrode layer 106 is called an element-forming layer 1118.

A more specific structure of the element 151 which has the layer containing an organic compound is hereinafter shown with reference to FIGS. 5A to 5E. It is to be noted that 205 in FIG. 5A corresponds to 105, a multilayer of 205 and 201 in FIG. 5B corresponds to 105, a multilayer of 205 and 202 in FIG. 5C corresponds to 105, a multilayer of 205 and 203 in FIG. 5D corresponds to 105, and a multilayer of 205, 245, and 244 in FIG. 5E corresponds to 105.

Figure 5A:
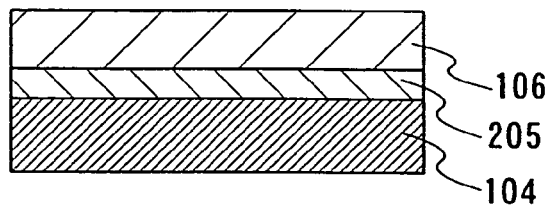
FIGS. 5A to 5E are cross-sectional views showing structures of storage elements applicable to the present invention.

Next, as shown in FIG. 5A, the element 151 which has the layer containing an organic compound functions as a storage element when a layer 205 containing an organic compound is formed with an organic compound which changes in a crystal condition, conductivity, and a shape by voltage applied to the first electrode layer and the second electrode layer. The layer 205 containing an organic compound may be provided in a single-layer structure or a multilayer structure by stacking a plurality of layers formed with different organic compounds.

The thickness of the layer 205 containing an organic compound is preferably set so that the electric resistance of the storage element changes by applying voltage to the first conductive layer and the second conductive layer. The typical thickness of the layer 205 containing an organic compound may range from 5 to 100 nm, preferably from 10 to 60 nm, and more preferably 5 to 30 nm.

The layer 205 containing an organic compound can be formed with an organic compound having a hole-transporting property or an organic compound having an electron-transporting property.

As the organic compound having a hole-transporting property, for example, phthalocyanine (abbreviation: $H_2Pc$), copper phthalocyanine (abbreviation: CuPc), and vanadyl phthalocyanine (VOPc) are given. Besides those, the following are given: 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 1,3,5-tris[N,N-di(m-tolyl)amino]benzene (abbreviation: m-MTDAB); N,N'-diphenyl-N,N'-bis(3-methylphenyl)-1,1'-biphenyl-4,4'-diamine (abbreviation: TPD); 4,4'-bis[N-(1-naphthyl)-N-phenylamino]biphenyl (abbreviation: NPB); 4,4'-bis{N-[4-di(m-tolyl)amino]phenyl-N-phenylamino}biphenyl (abbreviation: DNTPD); 4,4'-bis[N-(4-biphenylyl)-N-phenylamino]biphenyl (abbreviation: BBPB); 4,4',4''-tri(N-carbazolyl)triphenylamine (abbreviation: TCTA); and the like. However, the present invention is not restricted to these. Among the aforementioned compounds, aromatic amine compounds typified by TDATA, MTDATA, m-MTDAB, TPD, DNTPD, BBPB, and TCTA are preferable as the organic compound because they easily generate holes. The substances mentioned here mainly have a hole mobility of $10^{-6}$ cm$^2$/Vs or higher.

As the organic compound having an electron-transporting property, the following metal complex having a quinoline skeleton or a benzoquinoline skeleton, or the like can be used: tris(8-quinolinolato)aluminum (abbreviation: Alq$_3$); tris(4-methyl-8-quinolinolato)aluminum (abbreviation: Almq$_3$); bis(10-hydroxybenzo[h]-quinolinato)beryllium (abbreviation: BeBq$_2$); bis(2-methyl-8-quinolinolato)-4-phenylphenolato-aluminum (BAlq); and the like. Besides those, the following metal complex having an oxazole-based ligand or a thiazole-based ligand, or the like can be used: bis[2-(2-hydroxyphenyl)benzoxazolato]zinc (abbreviation: Zn(BOX)$_2$); bis[2-(2-hydroxyphenyl)benzothiazolato]zinc (abbreviation: Zn(BTZ)$_2$); and the like. Furthermore, in addition to the metal complex, 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like can also be used. The substances mentioned here mainly have an electron mobility of $10^{-6}$ cm$^2$/Vs or higher.

Figure 5B:
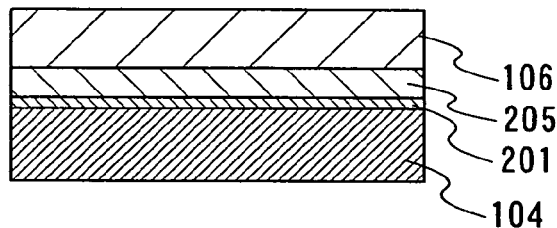

As shown in FIG. 5B, in the storage element, an insulating layer 201 may be formed between the first electrode layer 104 and the layer 205 containing an organic compound.

The insulating layer 201 is a layer for injecting charges of holes or electrons from the first electrode layer or the second electrode layer to the layer containing an organic compound, by a tunnel effect. The insulating layer 201 has the thickness capable of injecting charges to the layer 205 containing an organic compound by a tunnel effect at a predetermined voltage. The typical thickness of the insulating layer 201 ranges from 1 to 4 nm, preferably 1 to 2 nm. Since the insulating layer 201 is as thin as 1 to 4 nm, a tunnel effect occurs in the insulating layer 201, which improves the charge-injecting property to the layer 205 containing an organic compound. Thus, if the insulating layer 201 is thicker than 4 nm, the tunnel effect does not occur in the insulating layer 201, the electron injection into the layer 205 containing an organic compound gets difficult, and the applying voltage at writing in the storage element increases. Moreover, since the insulating layer 201 is as thin as 1 to 4 nm, throughput improves.

The insulating layer 201 is formed with a compound that is stable thermally and chemically.

As typical examples of the inorganic compound that forms the insulating layer 201, the following oxides having an insulating property are given: $Li_2O$; $Na_2O$; $K_2O$; $Rb_2O$; BeO; MgO; CaO; SrO; BaO; $Sc_2O_3$; $ZrO_2$; $HfO_2$; $RfO_2$; $TaO_2$; $TcO_2$; $MnO_2$; $Fe_2O_3$; CoO; PdO; $Ag_2O$; $Al_2O_3$; $Ga_2O_3$; $Bi_2O_3$; and the like.

As other typical examples of the inorganic compound that forms the insulating layer 201, the following fluorides having an insulating property are given: LiF; NaF; KF; CsF; $BeF_2$; $MgF_2$; $CaF_2$; $SrF_2$; $BaF_2$; $AlF_3$; AgF; $MnF_3$; and the like. Moreover, the following chlorides having an insulating property are given: LiCl; NaCl; KCl; CsCl; $BeCl_2$; $CaCl_2$; $BaCl_2$; $AlCl_3$; $SnCl_4$; $GeCl_4$; $SnCl_4$; $BeCl_2$; $CaCl_2$; $BaCl_2$; $AlCl_3$; $SiCl_4$; $GeCl_4$; $SnCl_4$; AgCl; $ZnCl_2$; $TiCl_4$; $TiCl_3$; $ZrCl_4$; $FeCl_3$; $PdCl_2$; $SbCl_3$; $SbCl_2$; $SrCl_2$; $TlCl_3$; CuCl; $CuCl_2$; $MnCl_2$; $RuCl_2$; and the like. The following bromides having an insulating property are given: KBr; CsBr; AgBr; $BaBr_2$; LiBr; and the like. Furthermore, the following iodides having an insulating property are given: NaI; KI; $BaI_2$; $TlI_3$; AgI; $TiI_4$; $CaI_2$; $SiI_4$; CsI; and the like.

As other typical examples of the inorganic compound that forms the insulating layer 201, the following carbonates having an insulating property are given: $Li_2CO_3$; $K_2CO_3$; $Na_2CO_3$; $MgCO_3$; $CaCO_3$; $SrCO_3$; $BaCO_3$; $MnCO_3$; $FeCO_3$; $CoCO_3$; $NiCO_3$; $CuCO_3$; $Ag_2CO_3$; $ZnCO_3$; and the like. In addition, the following sulfates having an insulating property are given: $Li_2SO_4$; $K_2SO_4$; $Na_2SO_4$; $MgSO_4$; $CaSO_4$; $SrSO_4$; $BaSO_4$; $Ti_2(SO_4)_3$; $Zr(SO_4)_2$; $MnSO_4$; $FeSO_4$; $Fe_2(SO_4)_3$; $CoSO_4$; $Co_2(SO_4)_3$; $NiSO_4$; $CuSO_4$; $Ag_2SO_4$; $ZnSO_4$; $Al_2(SO_4)_3$; $In_2(SO_4)_3$; $SnSO_4$; $SnSO_4$; $Sn(SO_4)_2$; $Sb_2(SO_4)_3$; $Bi_2(SO_4)_3$; and the like. In addition, the following nitrates having an insulating property are given: $LiNO_3$; $KNO_3$; $NaNO_3$; $Mg(NO_3)_2$; $Ca(NO_3)_2$; $Sr(NO_3)_2$; $Ba(NO_3)_2$; $Ti(NO_3)_4$; $Sr(NO_3)_2$; $Ba(NO_3)_2$; $Ti(NO_3)_4$; $Zr(NO_3)_4$; $Mn(NO_3)_2$; $Fe(NO_3)_2$; $Fe(NO_3)_3$; $Co(NO_3)_2$; $Ni(NO_3)_2$; $Cu(NO_3)_2$; $AgNO_3$; $Zn(NO_3)_2$; $Al(NO_3)_3$; $In(NO_3)_3$; $Sn(NO_3)_2$; and the like. Furthermore, nitrides having an insulating property, typified by AlN, SiN, and the like are given. The compositions of these inorganic compounds are not necessarily a strict integer ratio.

If the insulating layer 201 is formed with the inorganic compound, the thickness of the insulating layer is preferably in the range of 1 to 2 nm. When the insulating layer has the thickness of 3 nm or more, the voltage to be applied at writing increases.

As typical examples of the organic compound that forms the insulating layer 201, organic resins typified by polyimide, acrylic, polyamide, benzocyclobutene, polyester, a novolac resin, a melamine resin, a phenol resin, an epoxy resin, a silicon resin, a furan resin, a diarylphthalate resin, and the like are given.

The insulating layer 201 can be formed by an evaporation method, an electron beam evaporation method, a sputtering method, a CVD method, or the like. Moreover, a spin coating method, a sol-gel method, a printing method, a droplet discharging method, or the like can be used.

Figure 5C:
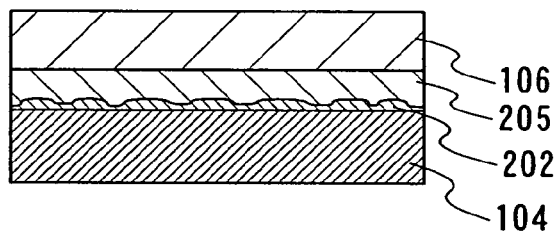

As shown in FIG. 5C, an insulating layer 202 having depression and projection, which is continuous may be used. However, in this case, it is preferable that the thickness of the insulating layer at the projection portion be in the range of 1 to 4 nm, preferably 2 to 4 nm and that of the insulating layer at the depression portion be 0.1 nm or more and less than 2 nm, preferably 1 nm or more and less than 2 nm.

Figure 5D:
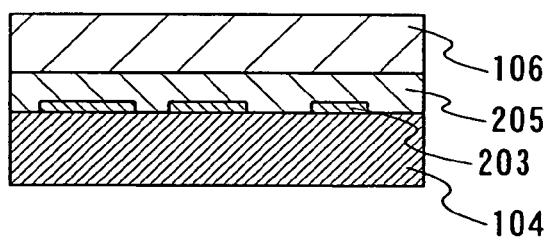

As shown in FIG. 5D, insulating layers 203 dispersed over the first electrode layer 104, which are discontinuous may be provided. The insulating layers 203 which are discontinuous may have island shapes, stripe shapes, net-like shapes, or the like.

Moreover, insulating particles may be provided instead of the insulating layers 201 to 203. Each of the insulating particles at this time preferably has a grain diameter of 1 to 4 nm.

Moreover, the insulating layers 201 to 203 or the insulating particles may be provided between the layer 205 containing an organic compound and the second electrode layer 106.

Since the insulating layer with a thickness of 4 nm or less, preferably 2 nm or less, is provided between the first electrode layer and the layer containing an organic compound or between the layer containing an organic compound and the second electrode layer, a tunnel current flows to the insulating layer. Thus, it is possible to decrease variation in applied voltage and current value at writing in the storage element. Moreover, when the insulating layer with a thickness of 4 nm or less, preferably 2 nm or less, is provided between the first electrode layer and the layer containing an organic compound or between the layer containing an organic compound and the second electrode layer, a charge-injecting property improves due to the tunnel effect, whereby the layer containing an organic compound can be made thicker. Thus, short-circuiting at an initial state can be prevented. Accordingly, the reliability of the storage device and the semiconductor device can be improved.

Figure 5E:
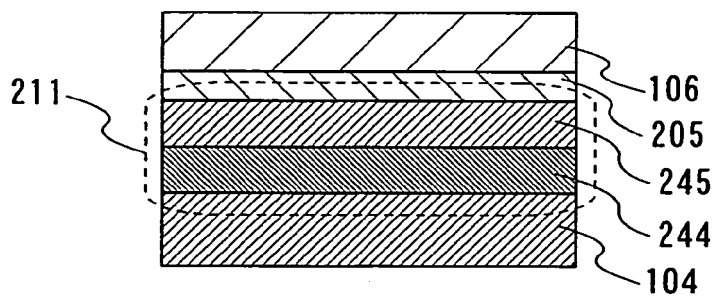

As another structure, an element having a rectifying property may be provided to the first electrode layer 104 or the second electrode layer 106 in the storage element (FIG. 5E). The element having a rectifying property is a transistor in which a gate electrode is connected to a drain electrode, or a diode. Here, a diode 211 including a third electrode layer and a semiconductor layer is provided in contact with the first electrode layer 104. Moreover, the element having a rectifying property may be provided between the layer 205 containing an organic compound and the first electrode layer 104. The element having a rectifying property may be formed between the layer 205 containing an organic compound and the second electrode layer 106. As a typical example of the diode, a PN junction diode, a diode having a PIN junction, an avalanche diode, or the like is given. A diode having another structure may be used. By providing the element having a rectifying property in this way, current flows only in one direction; therefore, errors decrease and margin of reading is increased.

When the layer 105 containing an organic compound is formed by a layer having a light-emitting function, the element 151 which has the layer containing an organic compound functions as a light-emitting element. In this case, the layer 105 containing an organic compound is formed with an organic compound having a light-emitting property.

As the organic compound having a light-emitting property, for example, the following are given: 9,10-di(2-naphthyl) anthracene (abbreviation: DNA); 2-tert-butyl-9,10-di(2-naphthyl)anthracene (abbreviation: t-BuDNA); 4,4'-bis(2,2-diphenylvinyl)biphenyl (abbreviation: DPVBi); coumarin 30; coumarin 6; coumarin 545; coumarin 545T; perylene; rubrene; periflanthene; 2,5,8,11-tetra(tert-butyl)perylene (abbreviation: TBP); 9,10-diphenylanthracene (abbreviation: DPA); 5,12-diphenyltetracene; 4-(dicyanomethylene)-2-methyl-6-[p-(dimethylamino)styryl]-4H-pyran (abbreviation: DCM1); 4-(dicyanomethylene)-2-methyl-6-[2-(julolidine-9-yl)ethenyl]-4H-pyran (abbreviation: DCM2); 4-(dicyanomethylene)-2,6-bis[p-(dimethylamino)styryl]-4H-pyran (abbreviation: BisDCM); and the like. Moreover, compounds capable of emitting phosphorescence such as the following can be given: bis[2-(4',6'-difluorophenyl)pyridinato-N,$C^2$] (picolinato)iridium (abbreviation: FIrpic); bis{2-[3',5'-bis (trifluoromethyl)phenyl]pydinato-N,$C^2$}(picolinato)iridium (abbreviation: Ir($CF_3$ ppy)$_2$(pic)); tris(2-phenylpyridinato-N, $C^2$)iridium (abbreviation: Ir(ppy)$_3$); (acetylacetonato)bis(2-phenylpyridinato-N,$C^2$)iridium (abbreviation: Ir(ppy)$_2$ (acac)); (acetylacetonato)bis[2-(2'-thienyl)pyridinato-N,$C^3$] iridium (abbreviation: Ir(thp)$_2$(acac)); (acetylacetonato)bis (2-phenylquinolinato-N,$C^2$)iridium (abbreviation: Ir(pq)$_2$ (acac)); (acetylacetonato)bis[2-(2'-benzothienyl)pyridinato-N,$C^3$]iridium (abbreviation: Ir(btp)$_2$(acac)), and the like.

Figure 6A:
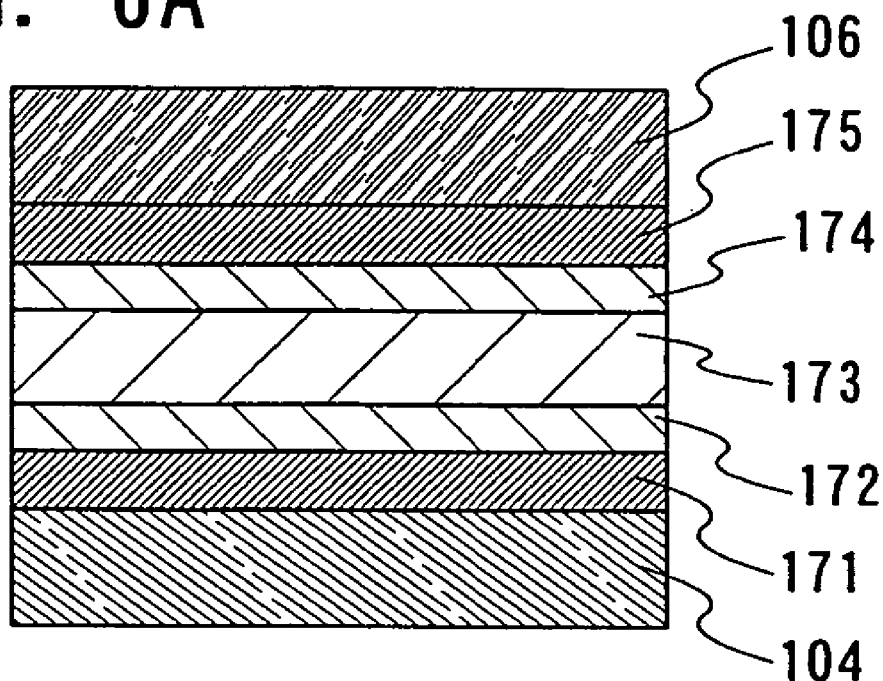
FIGS. 6A and 6B are cross-sectional views showing structures of light-emitting elements applicable to the present invention.
Figure 6B:
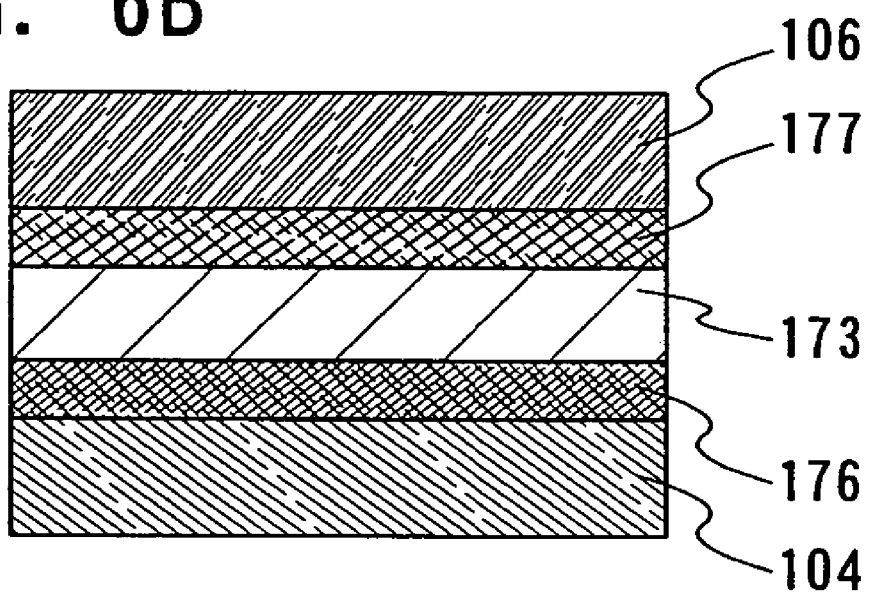

It is to be noted that a multilayer of 171 to 175 in FIG. 6A corresponds to 105, and a multilayer of 173, 176, and 177 in FIG. 6B corresponds to 105. As shown in FIG. 6A, the element 151 functioning as a light-emitting element may be formed by a hole-injecting layer 171 formed with a hole-injecting material, a hole-transporting layer 172 formed with a hole-transporting material, a light-emitting layer 173 formed with an organic compound having a light-emitting property, an electron-transporting layer 174 formed with an electron-transporting material, an electron-injecting layer 175 formed with an electron-injecting material, and the second electrode layer 106 which are provided over the first electrode layer 104.

The hole-transporting material cited in the description of the layer 205 containing an organic compound in FIG. 5A can be used appropriately as the hole-transporting material here.

A phthalocyanine-based compound is effective as the hole-injecting material, and phthalocyanine (abbreviation: $H_2Pc$), copper phthalocyanine (abbreviation: CuPc), vanadyl phthalocyanine (abbreviation: VOPc), and the like can be used. Moreover, a conductive high-molecular compound which has been chemically doped, polyethylene dioxythiophene (abbreviation: PEDOT) doped with polystyrenesulfonate (abbreviation: PSS), polyaniline (abbreviation: PAni), or the like can be used. Moreover, a thin film of an inorganic semiconductor such as molybdenum oxide ($MoO_x$), vanadium oxide ($VO_x$), or nickel oxide ($NiO_x$), or an ultrathin film of an inorganic insulator such as aluminum oxide ($Al_2O_3$) is also effective. Further, the following aromatic-amine-based compounds are also applicable: 4,4',4"-tris(N,N-diphenyl-amino)-triphenylamine (abbreviation: TDATA); 4,4',4"-tris[N-(3-methylphenyl)-N-phenyl-amino]-triphenylamine (abbreviation: MTDATA); N,N'-bis(3-methylphenyl)-N,N'-diphenyl-1,1'-biphenyl-4,4'-diamine (abbreviation: TPD); 4,4'-bis{N-[4-(N,N-di-m-tolylamino)phenyl]-N-phenylamino}biphenyl (abbreviation: DNTPD); and the like. Moreover, these aromatic-amine-based compounds may be doped with a substance having an acceptor property with respect to the aromatic-amine-based compounds; specifically, VOPc doped with 2,3,5,6-tetrafluoro-7,7,8,8-tetracyanoquinodimethane (abbreviation: $F_4$-TCNQ) or NPB doped with $MoO_x$, which is an acceptor, may be used.

As the electron-transporting material, the electron-transporting material cited in the description of the layer 205 containing an organic compound shown in FIG. 5A can be appropriately used here.

As the electron-injecting material, in addition to the aforementioned electron-transporting materials, an ultrathin film of an insulator is often used; for example, a halide of an alkali metal such as LiF or CsF, a halide of an alkaline earth metal such as $CaF_2$, or an oxide of an alkali metal such as $Li_2O$. Moreover, an alkali metal complex such as lithium acetylacetonate (abbreviation: Li(acac)) or 8-quinolinolato-lithium (abbreviation: Liq) is also effective. Further, a material in which the aforementioned electron-transporting material and a metal having a low work function such as Mg, Li, or Cs are mixed by co-evaporation or the like can be used.

As shown in FIG. 6B, the element 151 functioning as a light-emitting element may be formed by the first electrode layer 104, a hole-transporting layer 176 formed with an organic compound and an inorganic compound having an electron-accepting property with respect to the organic compound, a light-emitting layer 173, an electron-transporting layer 177 formed with an organic compound and an inorganic compound having an electron-donating property with respect to the organic compound, and the second electrode layer 106.

The hole-transporting layer 176 formed with an organic compound and an inorganic compound having an electron-accepting property with respect to the organic compound is formed by appropriately using the aforementioned organic compound having a hole-transporting property as the organic compound. As the inorganic compound, any inorganic compound can be used as long as electrons are easily accepted from the organic compound, and various metal oxides or metal nitrides can be used. In particular, an oxide of a transition metal belonging to any of Groups 4 to 12 in the periodic table of the elements is preferable because such an oxide is likely to have an electron-accepting property. Specifically, titanium oxide, zirconium oxide, vanadium oxide, molybdenum oxide, tungsten oxide, rhenium oxide, ruthenium oxide, zinc oxide, or the like is given. Among the metal oxides described above, an oxide of a transition metal belonging to any of Groups 4 to 8 in the periodic table of the elements is preferable for its high electron-accepting property. In particular, vanadium oxide, molybdenum oxide, tungsten oxide, and rhenium oxide are preferable because they can be evaporated in vacuum and are easily treated.

The electron-transporting layer 177 formed with an organic compound and an inorganic compound having an electron-donating property with respect to the organic compound is formed by appropriately using the aforementioned organic compound having an electron-transporting property as the organic compound. As the inorganic compound, any inorganic compound can be used as long as electrons are easily donated to the organic compound, and various metal oxides or metal nitrides can be used. In particular, an alkali metal oxide, an alkaline earth metal oxide, a rare earth metal oxide, an alkali metal nitride, an alkaline earth metal nitride, and a rare earth metal nitride are preferable because such oxides and nitrides are likely to have an electron-donating property. Specifically, lithium oxide, strontium oxide, barium oxide, erbium oxide, lithium nitride, magnesium nitride, calcium nitride, yttrium nitride, lanthanum nitride, or the like is given. In particular, lithium oxide, barium oxide, lithium nitride, magnesium nitride, and calcium nitride are preferable because they can be evaporated in vacuum and are easily treated.

Since the electron-transporting layer or the hole-transporting layer formed with the organic compound and the inorganic compound is superior in an electron-injecting/transporting property, various materials can be used to form the first electrode layer 104 and the second electrode layer 106 without much restriction by the work function. Moreover, the drive voltage can be decreased.

Figure 1C:
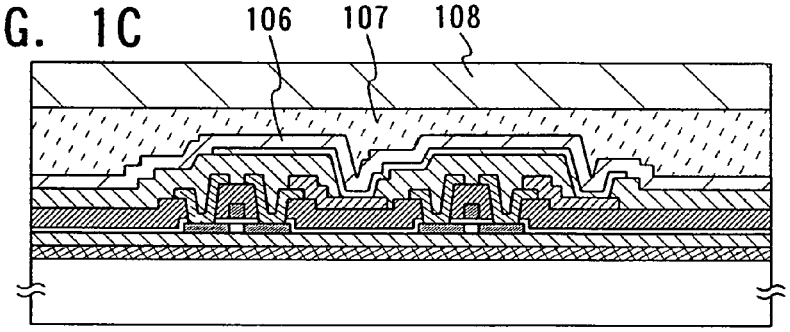

Next, as shown in FIG. 1C, an insulating layer 107 is formed over the second electrode layer 106. Next, a substrate 108 is attached to the surface of the insulating layer 107.

The insulating layer 107 is preferably formed by applying a composition by a coating method and then drying and/or baking the composition. Since the insulating layer 107 is provided as a protecting layer working in a later separation step, the insulating layer 107 preferably has little depression and projection on the surface. Such an insulating layer can be formed by a coating method. Moreover, the insulating layer 107 may be formed by forming a film by a thin-film forming method such as a CVD method or a sputtering method and then polishing the surface of the film by a CMP method. The insulating layer 107 formed by a coating method is formed by using an organic compound such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallylphthalate resin; an inorganic siloxane polymer including a Si—O—Si bond among compounds including hydrogen, oxygen, and silicon formed by using a siloxane-polymer-based material typified by silica glass as a starting material; or an organic siloxane polymer in which hydrogen bonded with silicon is substituted by an organic group such as methyl or phenyl, typified by an alkylsiloxane polymer, an alkylsilsesquioxane polymer, a silsesquioxane hydride polymer, an alkylsilsesquioxane hydride polymer. The insulating layer formed by the aforementioned thin-film forming method, which is then subjected to surface polishing by a CMP method, is formed with silicon oxide, silicon oxynitride, silicon nitride oxide, silicon nitride, or the like.

The substrate 108 is preferably a flexible, thin, and lightweight substrate. Typically, a substrate including PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like can be used. Moreover, paper made of a fibrous material, a multilayer film including a base material film (polyester, polyamide, an inorganic evaporated film, paper, or the like) and an adhesive organic resin film (an acrylic-based organic resin, an epoxy-based organic resin, or the like), or the like can also be used. In the case of using the aforementioned substrate, although not shown, the insulating layer 107 and the substrate 108 are attached to each other by providing an adhesive layer between the insulating layer 107 and the substrate 108.

Alternatively, a film having an adhesive layer to which a laminate process is carried out to an object to be processed by thermocompression (such as a laminating film (including polypropylene, polyester, vinyl, polyvinyl fluoride, vinyl chloride, or the like)) may be used as the substrate 108. The laminating film can be attached to an object to be processed in such a way that an adhesive layer provided on a surface of a film to be a base or a layer provided at an outermost layer of a film to be a base (not the adhesive layer) is melted by a heat treatment and then, by applying pressure thereto, the film is attached to the object to be processed. In this case, the adhesive layer is not necessarily provided between the insulating layer 107 and the substrate 108.

Here, the insulating layer 107 is formed using an epoxy resin in such a way that a composition is applied by a coating method and then the composition is dried and/or baked. Next, the substrate 108 is attached over the insulating layer 107 by thermocompressing the laminating film on the surface of the insulating layer 107.

Figure 1D:
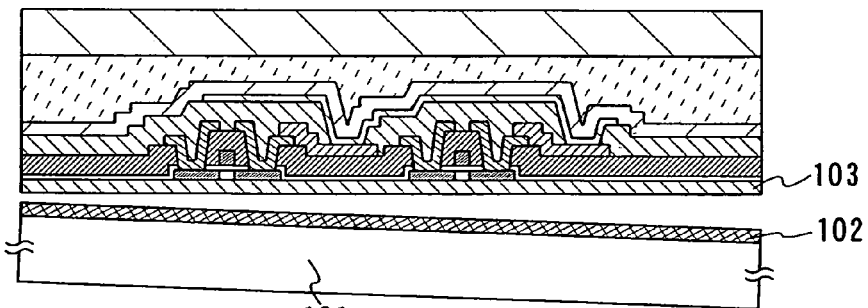

Next, as shown in FIG. 1D, the separation layer 102 and the insulating layer 103 are separated from each other. Here, the inorganic insulating layer 1115 and the second electrode layer 106 are in contact with each other. Since the adhesion between the inorganic insulating layer 1115 and the second electrode layer 106 is high, separation is difficult to occur at an interface between the layer 105 containing an organic compound and the second electrode layer 106 and the peeling layer 102 and the insulating layer 103 are separated from each other in a separation step.

Although this embodiment mode uses a method for physically separating the element-forming layer, in which the separation layer and the insulating layer are formed between the substrate and the element-forming layer, the metal oxide film is provided between the separation layer and the insulating layer, and the metal oxide film is weakened by crystallization, the present invention is not restricted to this method. Any of the following methods can also be used appropriately: (1) a method in which an amorphous silicon film containing hydrogen is provided between the substrate and the element-forming layer, and the amorphous silicon film is irradiated with laser light so that hydrogen gas in the amorphous silicon film is released, thereby separating the substrate; (2) a method in which the separation layer and the insulating layer are formed between the substrate and the element-forming layer, the metal oxide film is provided between the separation layer and the insulating layer, the metal oxide film is weakened by crystallization, a part of the separation layer is etched away using a solution or a halogen fluoride gas such as $NF_3$, $BrF_3$, or $ClF_3$, and separation is physically carried out at the weakened metal oxide film; (3) a method in which only the substrate of the substrate where the element-forming layer is formed is mechanically removed or is etched away using a solution or a halogen fluoride gas such as $NF_3$, $BrF_3$, or $ClF_3$; (4) a method in which a metal layer and a metal oxide layer are provided as the separation layer between the substrate having high heat resistance and a layer having a transistor, the metal oxide layer is weakened by crystallization, a part of the metal layer is etched away using a solution or a halogen fluoride gas such as $NF_3$, $BrF_3$, or $ClF_3$, and separation is physically carried out at the weakened metal oxide layer; and the like.

Figure 1E:
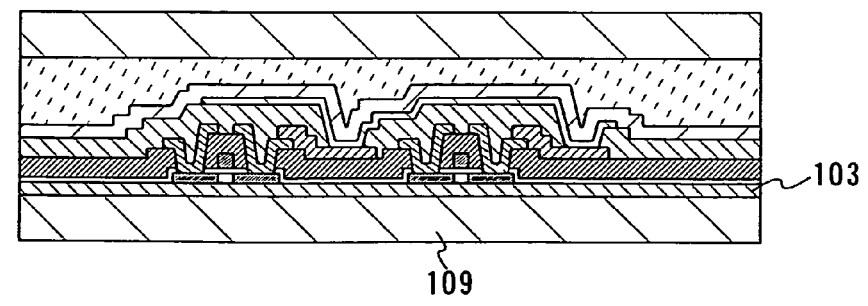

Next, as shown in FIG. 1E, a substrate 109 is attached to the surface of the insulating layer 103. The substrate 109 can be made of a similar material to that of the substrate 108. Here, the substrate 109 is attached over the insulating layer 103 by thermocompressing a laminating film.

In accordance with the above steps, the element which has the layer containing an organic compound can be provided over the flexible substrate with high yield by using the separation step.

Embodiment Mode 2

With reference to FIGS. 2A to 2E, this embodiment mode will describe a method for separating an element-forming layer, which is different from that in Embodiment Mode 1. This embodiment mode is different from Embodiment Mode 1 in that an organic insulating layer is formed instead of the inorganic insulating layer which covers an end portion of the first electrode layer.

Figure 2A:
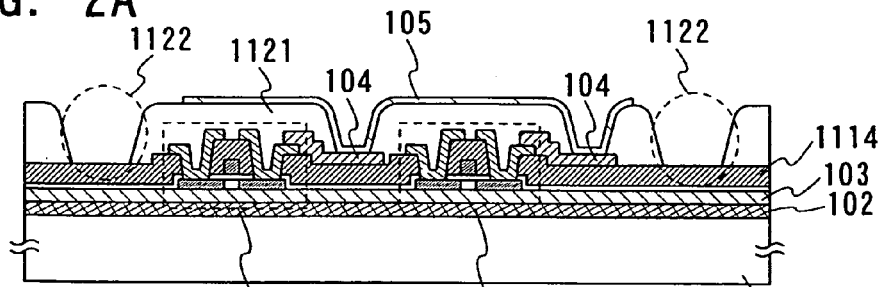
FIGS. 2A to 2E are cross-sectional views showing manufacturing steps of a semiconductor device of the present invention.

As shown in FIG. 2A, the separation layer 102 is formed over the substrate 101, the insulating layer 103 is formed over the separation layer 102, and the thin film transistor 1111 is formed over the insulating layer 103, similarly to Embodiment Mode 1. In this embodiment mode, an interlayer insulating layer for insulating a gate electrode from a wire of the thin film transistor 1111 is formed by using an inorganic insulating layer 1114, similarly to Embodiment Mode 1. Next, the first electrode layer 104 is formed over the inorganic insulating layer 1114.

Subsequently, an organic insulating layer 1121 is formed covering end portions of the first electrode layers 104. The organic insulating layer preferably has a cross sectional shape with a tilt angle of 30 to 75°, preferably 35 to 60°. By having such a tilt angle, the coverage for the end portion of the cross section of the later-formed layer containing an organic compound is improved, whereby breaking of the layer containing an organic compound due to steps can be prevented as well as yield can be improved.

The organic insulating layer 1121 is formed by a coating method, a printing method, or a droplet discharging method, using a photosensitive or nonphotosensitive organic compound such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallylphthalate resin. It is to be noted that the organic compound that forms the organic insulating layer 1121 has a polar substituent such as an imide group, a cyano group, or a hydroxyl group.

In the case of forming the organic insulating layer 1121 by applying a nonphotosensitive organic compound by a coating method, the organic insulating layer 1121 is formed in such a way that (1) an insulating film is formed by applying a composition and drying and baking the composition and (2) the insulating film is selectively etched away by using a resist mask formed by a photolithography step so that the first electrode layer 104 and the inorganic insulating layer 1114 are partially exposed. In the case of forming the organic insulating layer 1121 by applying a photosensitive organic compound by a coating method, the organic insulating layer 1121 is formed in such a way that a composition is applied and dried, and subsequently light-exposed, developed, and baked, and then partially removed so that the first electrode layer 104 and the inorganic insulating layer 1114 are partially exposed. The organic insulating layer 1121 formed by light-exposing and developing the photosensitive organic compound has curvature at an upper end portion thereof. Therefore, it is possible to prevent breaking of the later-formed layer containing an organic compound and to improve yield. In the case of forming the organic insulating layer 1121 by a printing method or a droplet discharging method, the organic insulating layer 1121 is formed in such a way that a composition is applied so as to cover an end portion of the first electrode layer 104 and partially expose the inorganic insulating layer 1114 and then the composition is dried and baked.

Here, the organic insulating layer 1121 is formed in such a way that (1) an insulating film is formed by applying a composition containing photosensitive polyimide by a coating method and drying and/or baking the composition, (2) the insulating film is light-exposed and developed by a photolithography step, thereby the first electrode layer 104 and the inorganic insulating layer 1114 are partially exposed. That is, the organic insulating layer 1121 is formed so as to form an exposed portion 1122 of the inorganic insulating layer 1114.

Next, the layer 105 containing an organic compound is formed over an exposed surface of the first electrode layer 104 and the organic insulating layer 1121, similarly to Embodiment Mode 1. It is to be noted that the layer 105 containing an organic compound is formed so as to partially expose the inorganic insulating layer 1114.

Figure 2B:
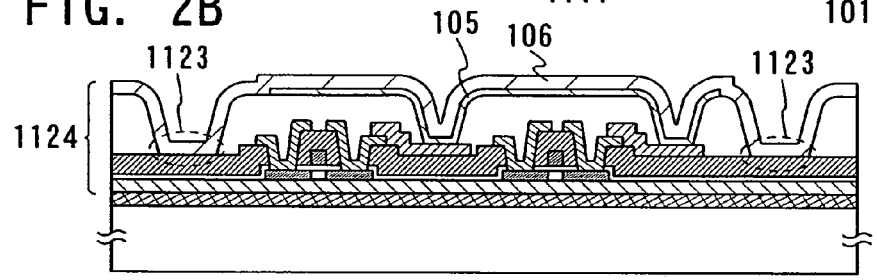

Subsequently, as shown in FIG. 2B, the second electrode layer 106 is formed over the layer 105 containing an organic compound and the exposed portion 1122 of the organic insulating layer 1121. Accordingly, a region 1123 can be formed where the inorganic insulating layer 1114 is in contact with the second electrode layer 106. In the region 1123 where the inorganic insulating layer 1114 is in contact with the second electrode layer 106, the adhesion between the inorganic insulating layer 1114 and the second electrode layer 106 is so high that separation is difficult to occur at an interface between the layer 105 containing an organic compound and the second electrode layer 106, and separation can be carried out by the separation layer 102 and the insulating layer 103.

It is to be noted that a stack containing the insulating layer 103 through the second electrode layer 106 is called an element-forming layer 1124.

Figure 2C:
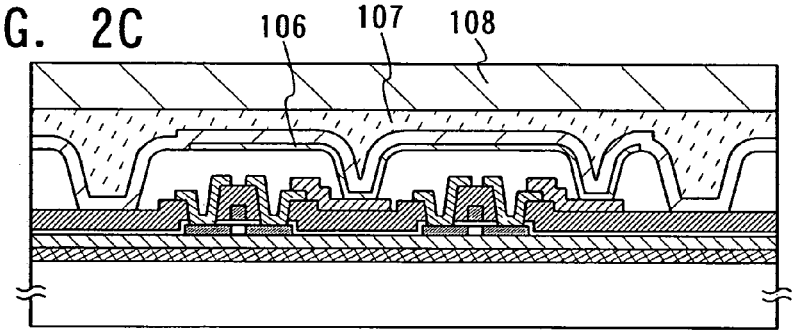
Figure 2D:
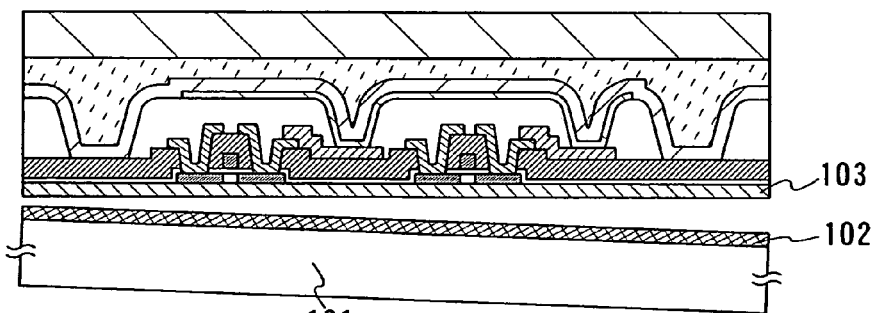
Figure 2E:
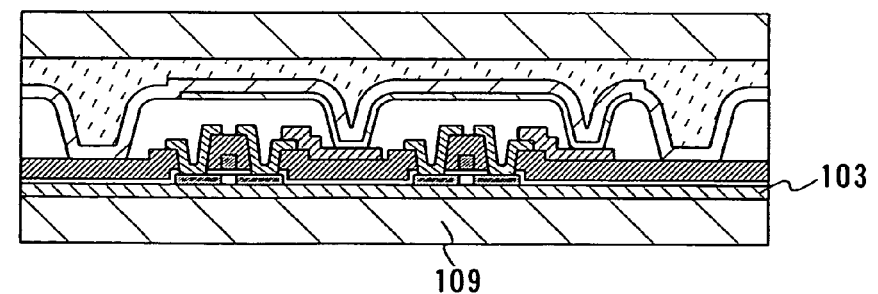

Since the formation of the insulating layer 107 and the attaching of the substrate 108 which are shown in FIG. 2C, the separation step shown in FIG. 2D, and the attaching of the substrate 109 shown in FIG. 2E are similar to those in Embodiment Mode 1, the description thereof is omitted here.

In accordance with the above steps, the element which has the layer containing an organic compound can be provided over the flexible substrate with high yield by using the separation step.

Embodiment Mode 3

This embodiment mode will describe a method for separating an element-forming layer, which is different from those in Embodiment Mode 1 and Embodiment Mode 2. This embodiment mode is different from Embodiment Mode 2 in that an organic insulating layer is formed instead of the inorganic insulating layer which insulates a gate electrode from a wire of the thin film transistor.

Figure 3A:
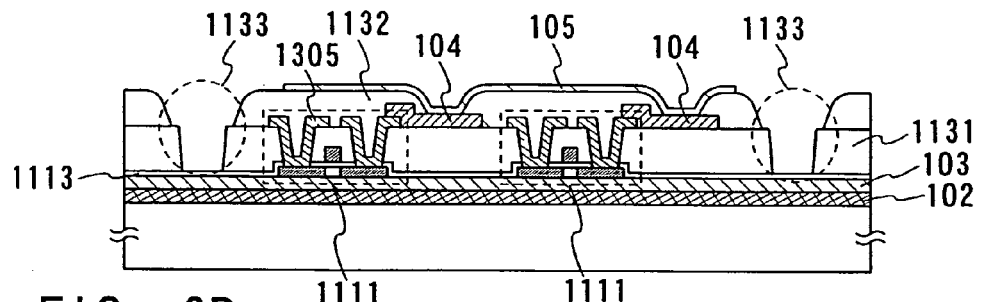
FIGS. 3A to 3E are cross-sectional views showing manufacturing steps of a semiconductor device of the present invention.

As shown in FIG. 3A, the separation layer 102 is formed over the substrate 101, the insulating layer 103 is formed over the separation layer 102, and the thin film transistor 1111 is formed over the insulating layer 103, similarly to Embodiment Mode 1.

In this embodiment mode, an interlayer insulating layer for insulating a gate electrode from a wire of the thin film transistor 1111 is formed by using a first organic insulating layer 1131, differently from Embodiment Mode 1 and Embodiment Mode 2. When wires are formed, after exposing a part of the gate insulating layer 1113 by removing a part of the first organic insulating layer through dry etching, a semiconductor layer is exposed by partially etching the gate insulating layer 1113 that covers the semiconductor layer. After that, the wire 1305 to be connected to the semiconductor layer is formed.

The organic insulating layer 1131 can be formed by appropriately selecting material and formation method of the organic insulating layer 1121 shown in Embodiment Mode 2. Here, the organic insulating layer 1131 is formed with a nonphotosensitive acrylic resin.

Next, the first electrode layer 104 to be connected to the wire 1305 is formed over the first organic insulating layer 1131.

Subsequently, a second organic insulating layer 1132 that covers an end portion of the first electrode layer 104 is formed. The second organic insulating layer 1132 can be formed similarly to the organic insulating layer 1121 of Embodiment Mode 2.

Here, the second organic insulating layer 1132 is formed in such a way that (1) a composition containing photosensitive polyimide is applied by a coating method and dried to form an insulating film with polyimide, (2) the insulating film is light-exposed and developed by a photolithography step and baked, thereby the first electrode layer 104 and the gate insulating layer 1113 are partially exposed. In other words, an exposed portion 1133 of the gate insulating layer 1113 is formed.

Next, the layer 105 containing an organic compound is formed over the second organic insulating layer 1132 and an exposed surface of the first electrode layer 104, similarly to Embodiment Mode 1. It is to be noted that the layer 105 containing an organic compound is formed so as not to cover the exposed portion 1133 of the gate insulating layer 1113.

Figure 3B:
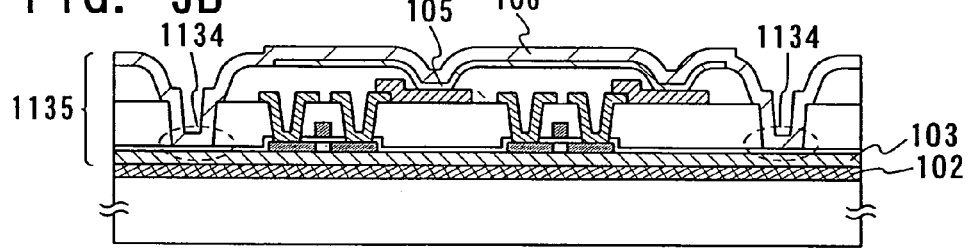

Next, as shown in FIG. 3B, the second electrode layer 106 is formed so as to be in contact with the layer 105 containing an organic compound and the exposed portion 1133 of the gate insulating layer 1113, similarly to Embodiment Mode 1. As a result, a region 1134 can be formed where the gate insulating layer 1113 is in contact with the second electrode layer 106. In the region 1134 where the gate insulating layer 1113 is in contact with the second electrode layer 106, the adhesion between the gate insulating layer 1113 and the second electrode layer 106 is so high that separation is difficult to occur at the interface between the layer 105 containing an organic compound and the second electrode layer 106, and separation can be carried out by the separation layer 102 and the insulating layer 103 in a separation step.

Here, a stack containing the insulating layer 103 through the second electrode layer 106 is called an element-forming layer 1135.

Figure 3C:
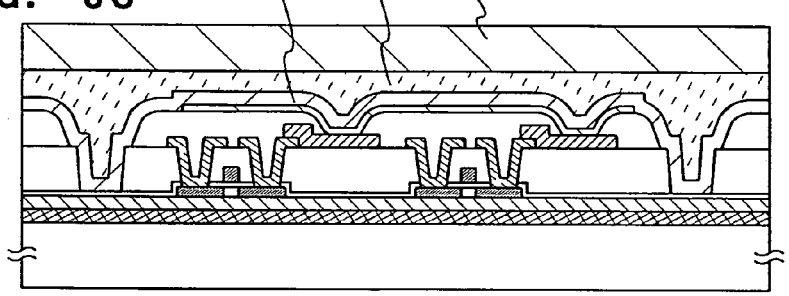
Figure 3D:
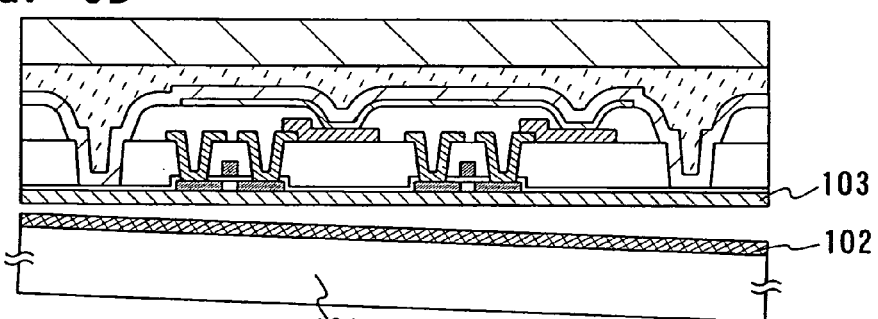
Figure 3E:
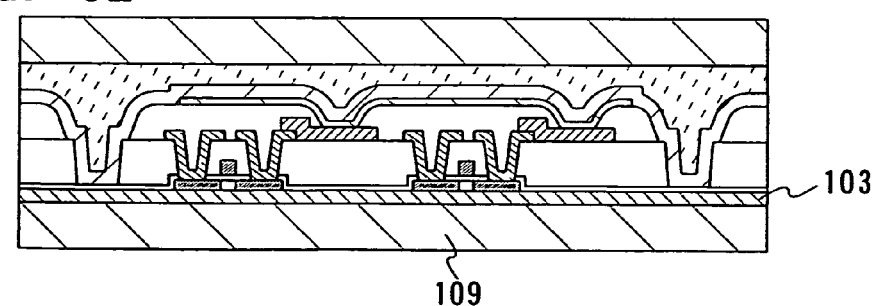

Since the formation of the insulating layer 107 and the attaching of the substrate 108 which are shown in FIG. 3C, the separation step shown in FIG. 3D, and the attaching of the substrate 109 shown in FIG. 3E are similar to those in Embodiment Mode 1, the description thereof is omitted here.

In accordance with the above steps, the element which has the layer containing an organic compound can be provided over the flexible substrate with high yield by using the separation step.

Embodiment Mode 4

This embodiment mode will describe a method for separating an element-forming layer which has a different structure from those in Embodiment Mode 1 to Embodiment Mode 3. This embodiment mode is different from Embodiment Mode 3 in that the second electrode layer is in contact with one or more of the first conductive layer formed similarly to the gate electrode of the thin film transistor, the second conductive layer formed similarly to the wire of the thin film transistor, and a third conductive layer formed similarly to the first electrode layer. This embodiment mode will show a structure in which the first conductive layer, the second conductive layer, and the third conductive layer are stacked and the third conductive layer is in contact with the second conductive layer.

Figure 4A:
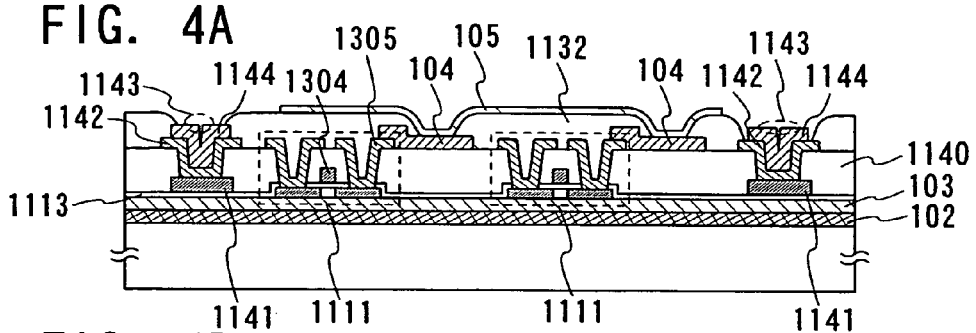
FIGS. 4A to 4E are cross-sectional views showing manufacturing steps of a semiconductor device of the present invention.

As shown in FIG. 4A, the separation layer 102 is formed over the substrate 101, the insulating layer 103 is formed over the separation layer 102, and the thin film transistor 1111 is formed over the insulating layer 103, similarly to Embodiment Mode 1. In this embodiment mode, after forming a conductive film over the gate insulating layer 1113, the conductive film is selectively etched by using a resist mask formed by a photolithography step, thereby forming the gate electrode 1304 and a first conductive layer 1141.

The interlayer insulating layer for insulating the gate electrode and the wire of the thin film transistor 1111 is formed by using a first organic insulating layer 1140, similarly to Embodiment Mode 3. A part of the first organic insulating layer 1140 exposes a part of the first conductive layer 1141.

After that, the wire 1305 to be connected to the semiconductor layer is formed as well as a second conductive layer 1142 which is in contact with the first conductive layer 1141. Typically, after forming a conductive film over the first organic insulating layer 1140, the gate electrode 1304, and the first conductive layer 1141, the conductive film is selectively etched by using a resist mask formed by a photolithography step, thereby forming the wire 1305 and the second conductive layer 1142.

Next, the first electrode layer 104 is formed over the first organic insulating layer 1140 as well as a third conductive layer 1144 over the second conductive layer 1142.

Next, the second organic insulating layer 1132 that covers end portions of the first conductive layer 104 is formed. The second organic insulating layer 1132 can be formed similarly to the organic insulating layer 1121 of Embodiment Mode 2.

Next, the layer 105 containing an organic compound is formed over the second organic insulating layer 1132 and an exposed surface of the first electrode layer 104, similarly to Embodiment Mode 1. It is to be noted that the layer 105 containing an organic compound is formed so as to partially expose the third conductive layer 1144. A reference numeral 1143 denotes an exposed portion of the third conductive layer 1144.

Figure 4B:
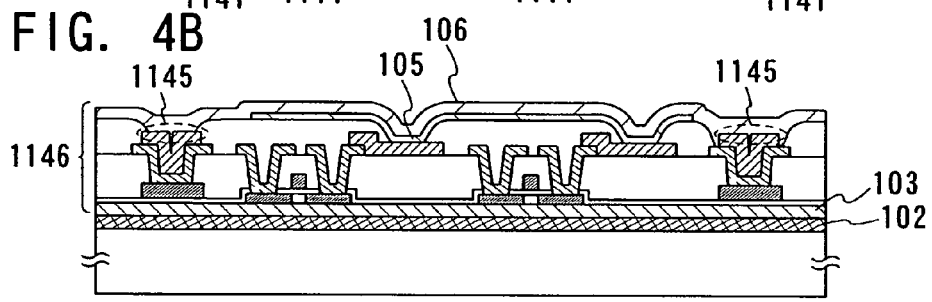

Next, as shown in FIG. 4B, the second electrode layer 106 is formed so as to be in contact with the layer 105 containing an organic compound and the exposed portion 1143 of the third conductive layer 1144, similarly to Embodiment Mode 1. As a result, a region 1145 can be formed where the third conductive layer 1144 is in contact with the second electrode layer 106. In the region 1145 where the third conductive layer 1144 is in contact with the second electrode layer 106, the adhesion between the third conductive layer 1144 and the second electrode layer 106 is so high that separation is difficult to occur at the interface between the layer 105 containing an organic compound and the second electrode layer 106, and separation can be carried out by the separation layer 102 and the insulating layer 103 in a separation step.

Figure 11A:
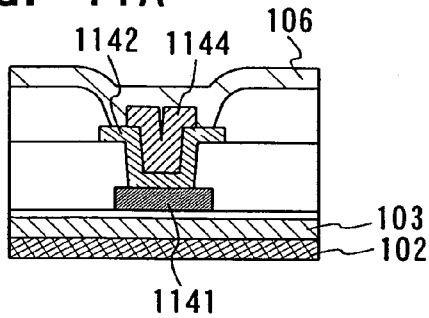
FIGS. 11A to 11I are cross-sectional views showing structures of semiconductor devices of the present invention.

The second electrode layer 106 may be in contact with the second conductive layer 1142 and the third conductive layer 1144 as shown in FIG. 11A.

Figure 11B:
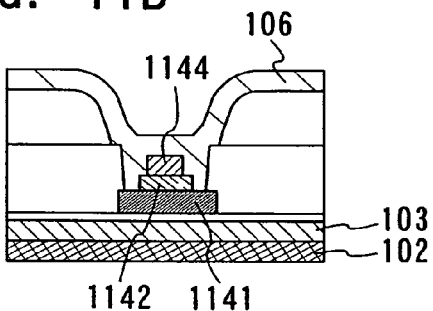

The second electrode layer 106 may be in contact with the first conductive layer 1141, the second conductive layer 1142, and the third conductive layer 1144 as shown in FIG. 11B.

Figure 11C:
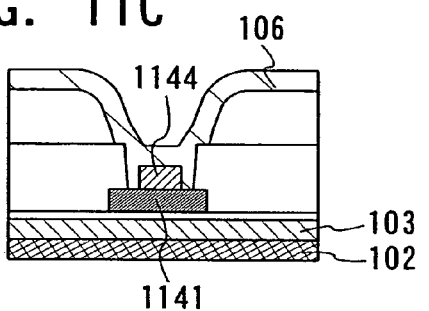

The second electrode layer 106 may be in contact with the first conductive layer 1141 and the third conductive layer 1144 as shown in FIG. 11C.

Figure 11D:
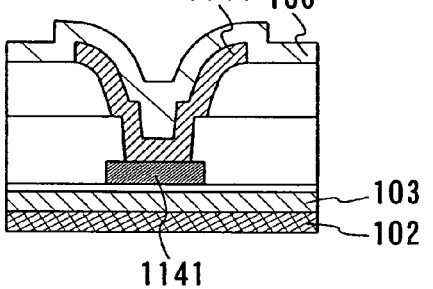

The second electrode layer 106 may be in contact with the third conductive layer 1144 as shown in FIG. 11D. Here, the third conductive layer 1144 is also in contact with the first conductive layer 1141.

Figure 11E:
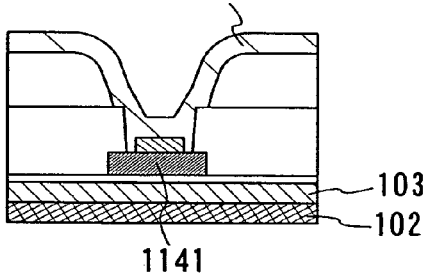

The second electrode layer 106 may be in contact with the first conductive layer 1141 and the second conductive layer 1142 as shown in FIG. 11E.

Figure 11F:
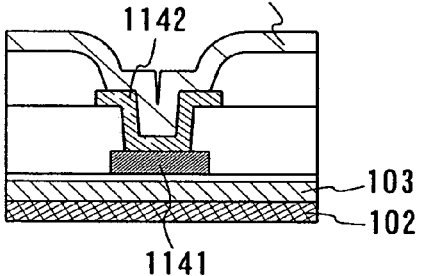

The second electrode layer 106 may be in contact with the second conductive layer 1142 as shown in FIG. 11F. Here, the second conductive layer 1142 is also in contact with the first conductive layer 1141.

Figure 11G:
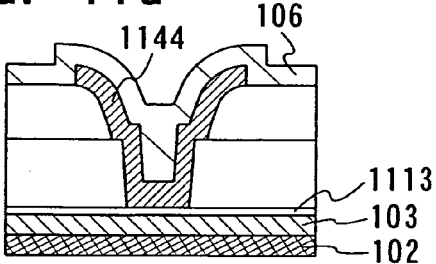

The second electrode layer 106 may be in contact with the third conductive layer 1144 as shown in FIG. 11G. Here, the third conductive layer 1144 is also in contact with the gate insulating layer 1113.

Figure 11H:
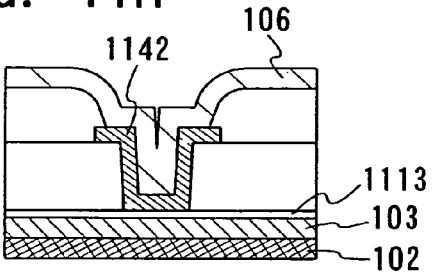

The second electrode layer 106 may be in contact with the second conductive layer 1142 as shown in FIG. 11H. Here, the second conductive layer 1142 is also in contact with the gate insulating layer 1113.

Figure 11I:
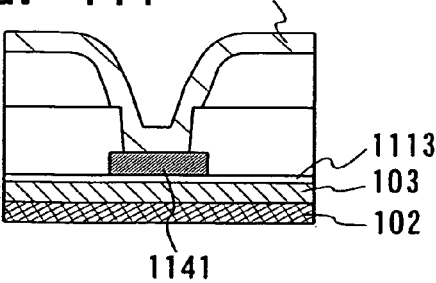

The second electrode layer 106 may be in contact with the first conductive layer 1141 as shown in FIG. 11I. Here, the first conductive layer 1141 is also in contact with the gate insulating layer 1113.

Here, a stack containing the insulating layer 103 through the second electrode layer 106 is called an element-forming layer 1146 as shown in FIG. 4B.

Figure 4C:
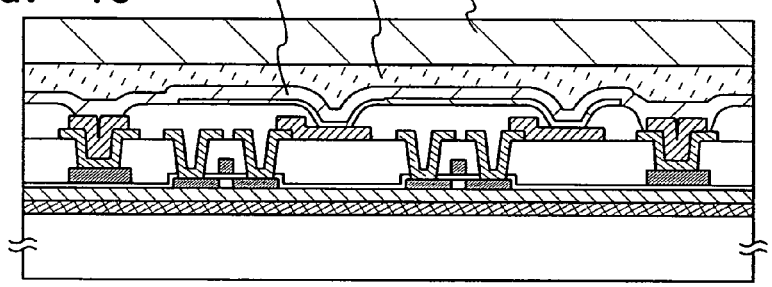
Figure 4D:
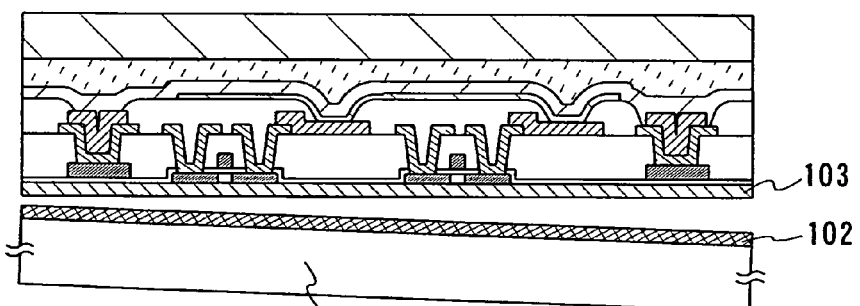
Figure 4E:
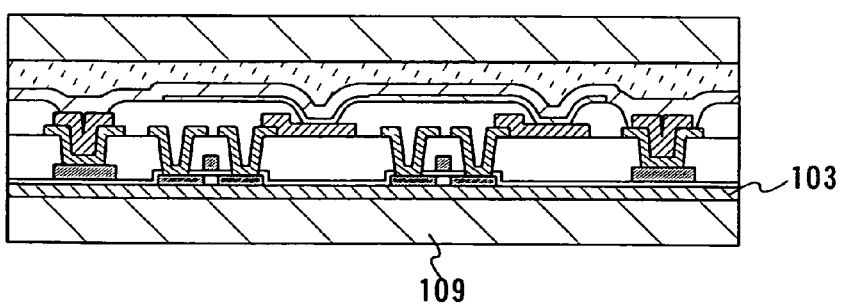

Since the formation of the insulating layer 107 and the attaching of the substrate 108 which are shown in FIG. 4C, the separation step shown in FIG. 4D, and the attaching of the substrate 109 shown in FIG. 4E are similar to those in Embodiment Mode 1, the description thereof is omitted here.

In accordance with the above steps, the element which has the layer containing an organic compound can be provided over the flexible substrate with high yield by using the separation step.

Embodiment 1

This embodiment will describe a semiconductor device having a storage element as an element which has a layer containing an organic compound, typically a storage device.

Figure 8A:
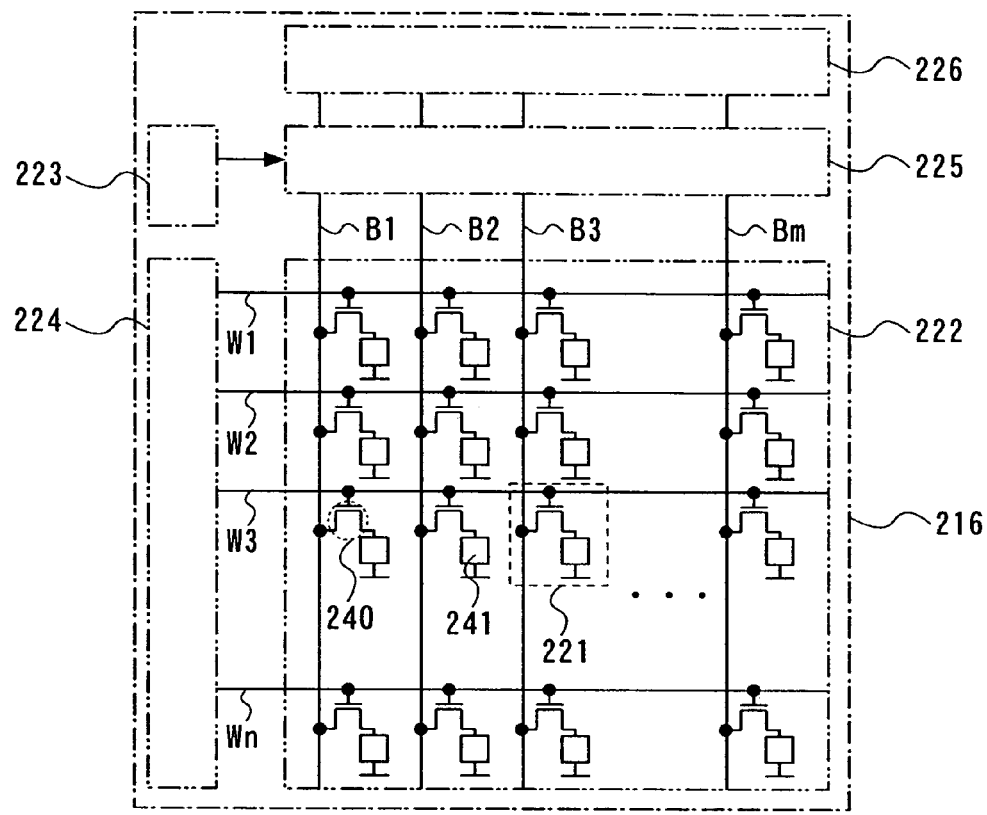
FIGS. 8A to 8C show semiconductor devices of the present invention.

FIG. 8A shows a structural example of a semiconductor device which will be described in this embodiment. The semiconductor device includes a memory cell array 222 in which memory cells 221 are arranged in a matrix form, a decoder 223, a word line driver circuit 224, a selector 225, and a reading/writing circuit 226. It is to be noted that the structure of a storage device 216 shown here is just an example, and other circuits such as a sense amplifier, an output circuit, and a buffer may be provided.

A bit line driver circuit, the word line driver circuit 224, a writing circuit, an interface, and the like can be formed over a substrate by using thin film transistors similarly to a storage element. Alternatively, they may be attached externally as IC chips.

The memory cell 221 has a first wire connected to a bit line Bx ($1 \leq x \leq m$), a second wire connected to a word line Wy ($1 \leq y \leq n$), a thin film transistor 240, and a storage element 241. The storage element 241 has a structure in which a layer containing an organic compound is sandwiched between a pair of conductive layers.

Figure 9A:
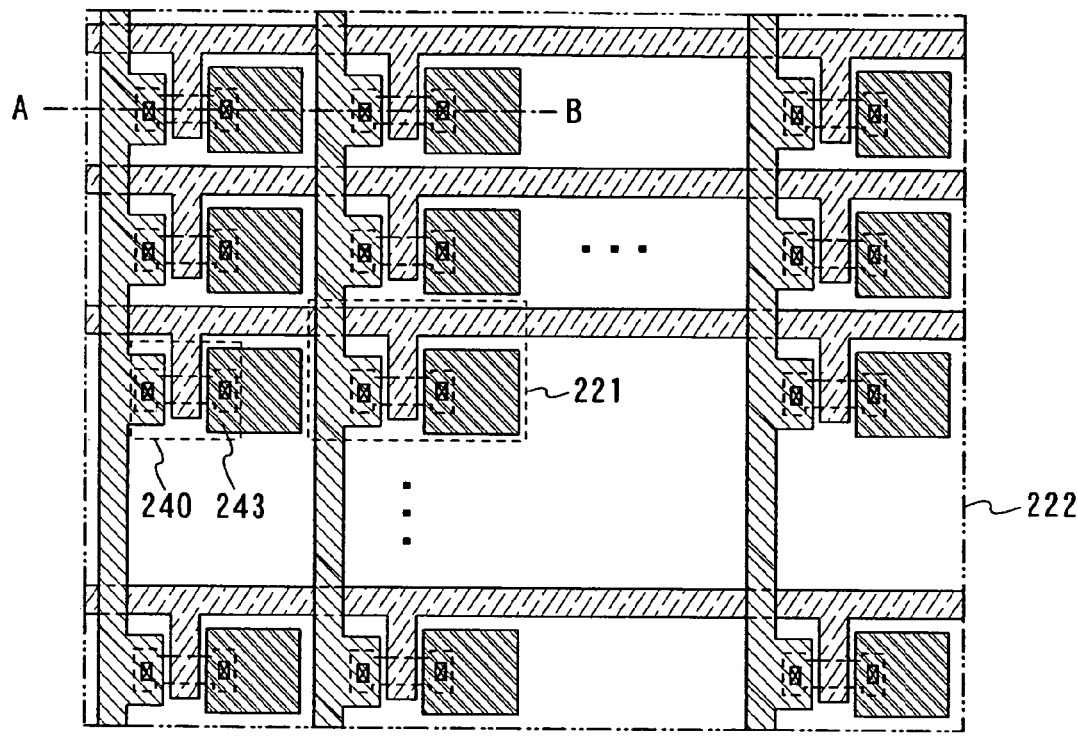
FIG. 9A is a top view and FIG. 9B is a cross-sectional view, both of which show a semiconductor device of the present invention.
Figure 9B:
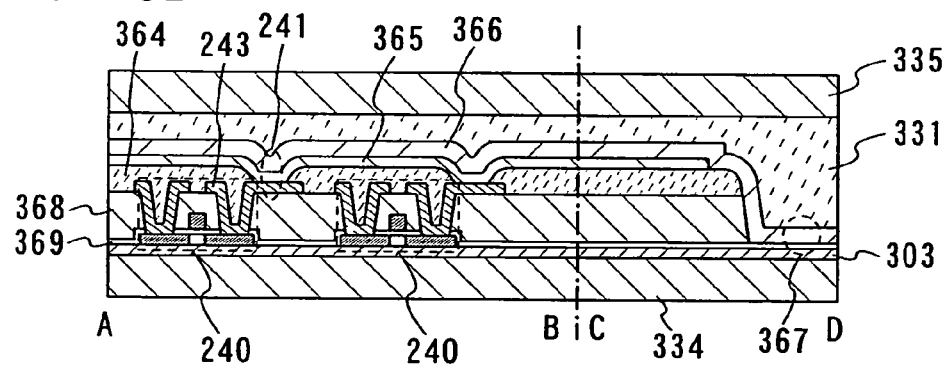

Next, examples of a top view and a cross-sectional view of the memory cell array 222 having the aforementioned structure are described with reference to FIGS. 9A and 9B. FIG. 9A shows an example of a top view of the memory cell array 222, and FIG. 9B is a cross-sectional view along a line A-B in FIG. 9A and also shows along a line C-D a peripheral portion of the memory cell array 222 which is not shown in FIG. 9A. In FIG. 9A, an organic insulating layer 364, an insulating layer 331, a layer 265 containing an organic compound, and a second electrode layer 366 which are formed over a first electrode layer 243 are omitted.

In the memory cell array 222, a plurality of memory cells 221 are arranged in a matrix form. In the memory cell 221, the thin film transistor 240 functioning as a switching element and the storage element 241 connected to the thin film transistor 240 are provided over a substrate 334, here a plastic substrate (see FIGS. 9A and 9B).

The storage element 241 has the first electrode layer 243 formed over an organic insulating layer 368, a layer 365 containing an organic compound which covers the first electrode layer 243 and the organic insulating layer 364, and the second electrode layer 366. Moreover, the organic insulating layer 364 covers a part of the first electrode layer 243.

A region 367 is formed where a gate insulating layer 369 of the thin film transistor 240 is in contact with the second electrode layer 366, in a peripheral portion C-D.

An insulating layer 331 is formed over the second electrode layer 366 to suppress depression and projection on the surface, and a plastic substrate 335 is attached over the insulating layer 331.

Although FIG. 9B shows an example in which the layer 365 containing an organic compound is formed so as to overlap with a plurality of the first electrode layers, the layer 365 containing an organic compound may be formed selectively only in each memory cell. In the latter case, the layer 365 containing an organic compound can be formed by an evaporation method using a metal mask. Further, usage efficiency of the material can be improved by selectively providing the layer containing an organic compound in such a way that an organic compound is discharged by a droplet discharging method or the like and the organic compound is baked.

The first electrode layer 243 and the second electrode layer 366 can be formed by similar material and forming method to those described in Embodiment Mode 1.

The layer 365 containing an organic compound can be provided by similar material and forming method to those of the layer 105 containing an organic compound described in Embodiment Mode 1.

Reduction in size, thickness, and weight of the semiconductor device can be achieved when the flexible substrate, the laminating film, the paper made of a fibrous material, or the like described as the substrates 108 and 109 in Embodiment Mode 1 is used as the substrates 334 and 335.

Next, a method for manufacturing an active matrix type semiconductor device is described with reference to FIGS. 10A and 10B.

Figure 10A:
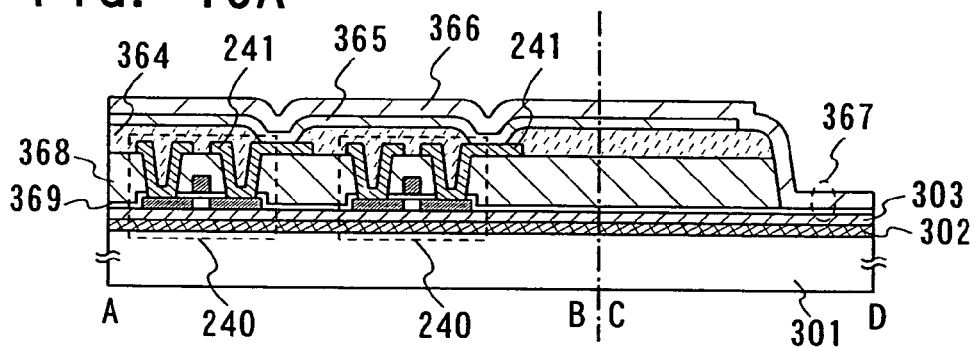
FIGS. 10A to 10D are cross-sectional views showing manufacturing steps of a semiconductor device of the present invention.

FIG. 10A is a cross-sectional view of a memory cell array of an active matrix type semiconductor device. It is to be noted that peripheral circuits such as a bit line driver circuit, a word line driver circuit, and an interface are omitted.

As shown in FIG. 10A, a separation layer 302 is formed in 30 nm thick over a substrate 301, and an insulating layer 303 is formed over the separation layer 302. Next, a TFT 240 is formed over the insulating layer 303. Here, a glass substrate is used as the substrate 301.

Here, an interlayer insulating layer for insulating a gate electrode and source and drain electrodes of the TFT 240 is formed by the organic insulating layer 368. Therefore, in a peripheral portion C-D, a part of the organic insulating layer 368 is removed to expose the gate insulating layer 369 of the TFT.

Next, the organic insulating layer 364 is formed over the TFT 240. Then, the layer 365 containing an organic compound is formed over the organic insulating layer 364 and the exposed portion of the source or drain electrode of the TFT, and the second electrode layer 366 is formed over the layer 365 containing an organic compound and the gate insulating layer 369.

Here, the second electrode layer 366 is formed so that the region 367 is formed where the gate insulating layer 369 is in contact with the second electrode layer 366. In the region where the gate insulating layer 369 is in contact with the second electrode layer 366, the adhesion between the gate insulating layer 369 and the second electrode layer 366 is so high that the separation layer and the insulating layer can be separated from each other with high yield in a later separation step.

Figure 10B:
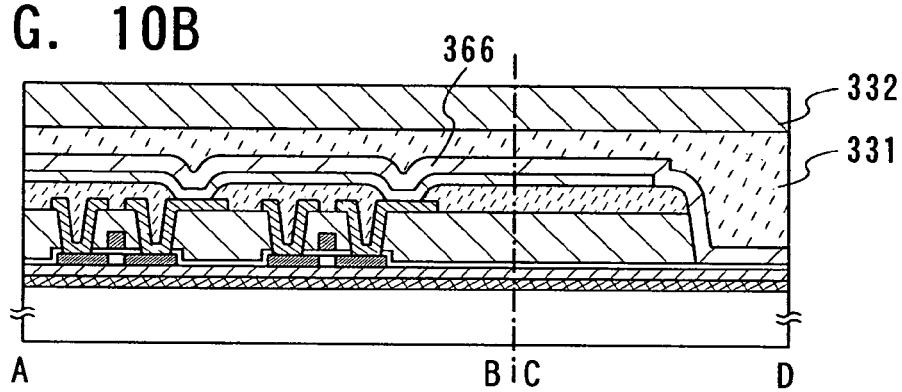

Subsequently, after forming the insulating layer 331 over the second electrode layer 366, a plastic film 332 having an adhesive layer is attached over the insulating layer 331 as shown in FIG. 10B. Next, after attaching a minimally sticky tape (not shown) on the surface of the substrate 301, the adhesive layer of the plastic film 332 is plasticized by being heated at 120 to 150° C.; thus, the plastic film 332 is attached to the insulating layer 331.

Figure 10C:
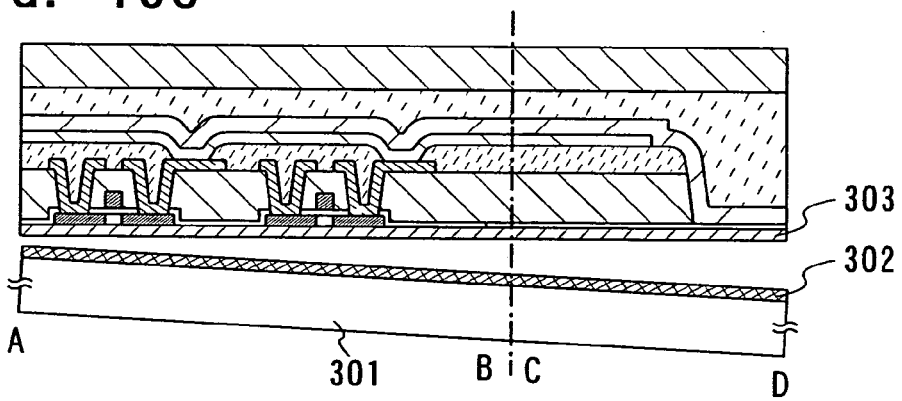

Then, the substrate 301 is provided over a flat surface, a roller (not shown) having a sticky layer is fixed to the surface of the plastic film 332 while applying pressure thereto, and then separation is carried out at an interface between the separation layer 302 and the insulating layer 303 as shown in FIG. 10C.

Figure 10D:
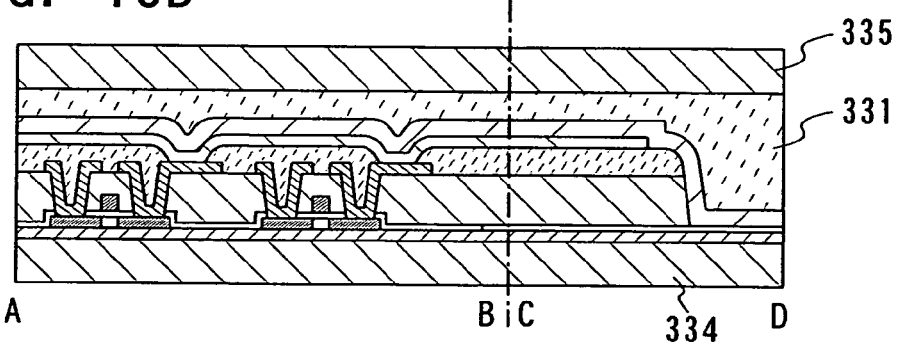

Subsequently, as shown in FIG. 10D, the substrate 334 having an adhesive layer is attached to the surface of the insulating layer 303 and heated at 120 to 150° C. so that the adhesive layer of the substrate 334 is plasticized. Thus, the substrate 334 is attached to the surface of the insulating layer 303.

By the above steps, the active matrix type semiconductor device provided over a plastic film can be manufactured. Any of Embodiment Modes 1 to 4 can be applied to this embodiment.

Next, operation at data writing in the storage device 216 is described (FIGS. 8A to 9B).

Here, a case is described in which data writing is carried out by an electric action, typically voltage application. The writing is carried out by changing electrical characteristics of a memory cell, and it is assumed that an initial state of the memory cell (a state in which an electric action is not applied) is data "0" and a state in which the electrical characteristics are changed is data "1".

A case is described in which data is written in the memory cell 221 in column n, row m. In the case of writing data "1" in the memory cell 221, the memory cell 221 is selected by the decoder 223 and the selector 225. Specifically, a predetermined voltage of V22 is applied by the decoder 223 to a word line Wn connected to the memory cell 221. The bit line Bm connected to the memory cell 221 is connected to the reading/writing circuit 226 by the decoder 223 and the selector 225. Then, a writing voltage of V21 is outputted from the reading/writing circuit 226 to the bit line B3.

Figure 7A:
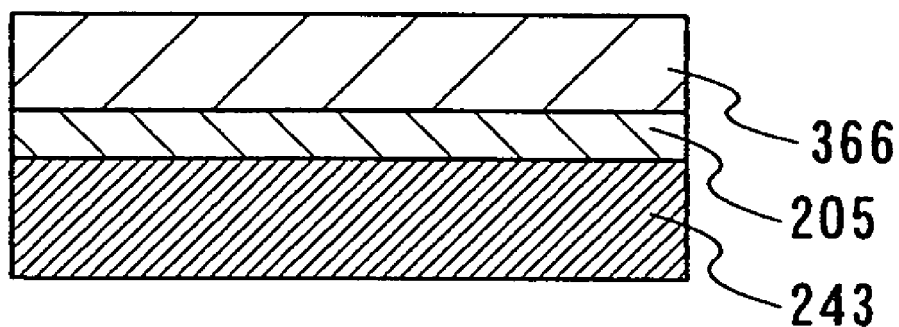
FIGS. 7A and 7B are cross-sectional views showing structures of storage elements applicable to the present invention.
Figure 7B:
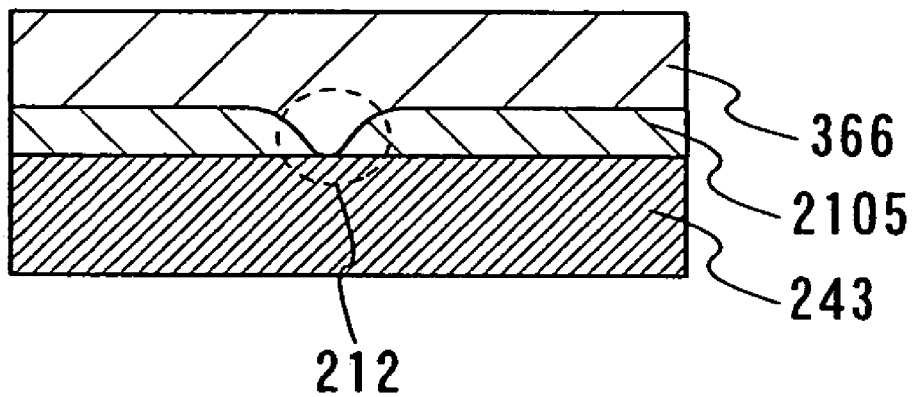

Thus, the thin film transistor 240 that constitutes a part of the memory cell is turned on and the storage element 241 is electrically connected to a common electrode and a bit line, and then a voltage of approximately Vw=Vcom−V21 is applied. By selecting the voltage Vw appropriately, the layer containing an organic compound provided between the electrode layers can be changed physically or electrically, thereby writing data "1". Specifically, the electrical resistance between the first electrode layer and the second electrode layer in a data "1" state at the reading operation voltage may be changed so as to be much smaller than that in a data "0" state, or the circuit may be simply shorted. The short-circuited storage element has a region 212 where the circuits are shorted as shown in FIG. 7B. The potential may be selected appropriately within the range of (V21, V22, Vcom)=(5 to 15 V, 5 to 15 V, 0 V) or (−12 to 0 V, −12 to 0 V, 3 to 5 V). The voltage Vw may be in the range of 5 to 15 V or −15 to −5 V.

The voltage is controlled so that the data "1" is not written in the memory cells connected to unselected word lines and unselected bit lines. Specifically, a potential for turning off the transistor of the memory cell (for example, 0 V) is applied to the unselected word lines to make the unselected bit lines set in a floating state, or a potential of the same degree as Vcom may be applied.

Meanwhile, in the case of writing the data "0" in the memory cell 221, the electric action is not applied to the memory cell 221. At circuit operation, for example, the memory cell 221 is selected by the decoder 223 and the selector 225, similarly to the case of writing the data "1", but the output potential from the reading/writing circuit 226 to the bit line B3 is set to be the same degree as Vcom or the bit line B3 is made to be a floating state. Accordingly, a low voltage (for example, −5 to 5 V) is applied to the storage element 241 or voltage is not applied, whereby the electrical characteristics do not change; therefore, writing of data "0" is achieved.

Figure 8B:
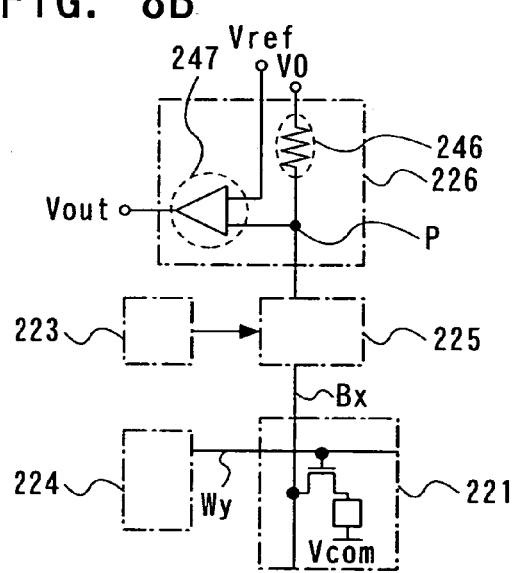
Figure 8C:
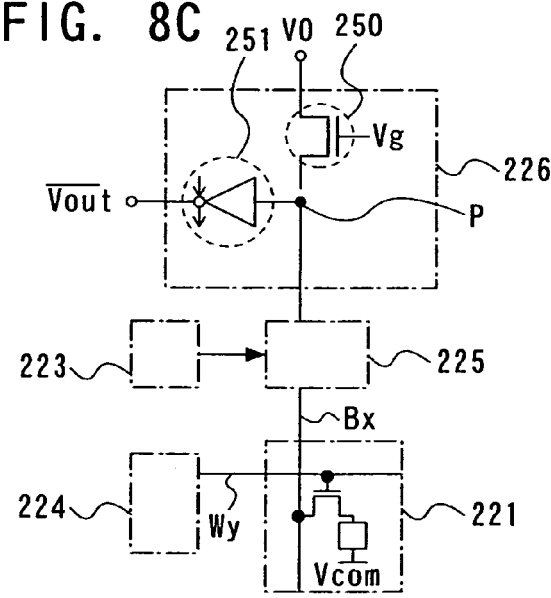

Subsequently, operation for reading data by an electric action is described (FIGS. 8A to 8C). The data reading is carried out by using the difference between the memory cell having the data "0" and the memory cell having the data "1" in the electrical characteristic of the storage element 241. For example, the electrical resistance of a storage element that forms the memory cell having the data "0" is assumed to be R0 at the reading voltage while the electrical resistance of a storage element that forms the memory cell having the data "1" is assumed to be R1 at the reading voltage, based on which a method of reading the data by using the difference in the electrical resistance is described. It is to be noted that R1<R0. In the reading/writing circuit, the circuit 226 using a resistor element 246 and a differential amplifier 247 shown in FIG. 8B can be considered as a structure of a reading portion. The resistor element has a resistance value Rr, and R1<Rr<R0. A transistor 250 may be provided instead of the resistor element 246 and a clocked inverter 251 may be used instead of the differential amplifier (FIG. 8C). It is needless to say that the circuit structure is not limited to that shown in FIGS. 8A to 8C.

At data reading from the memory cell 221 in column n and row m, the memory cell 221 is selected first by the decoder 223 and the selector 225. Specifically, a predetermined voltage of V24 is applied to the word line Wn connected to the memory cell 221 by the decoder 223 so that the thin film transistor 240 is turned on. Moreover, the bit line Bm connected to the memory cell 221 is connected to a terminal P of the reading/writing circuit 226 by the decoder 223 and the selector 225. As a result, the terminal P has a potential Vp, which is obtained by Vcom and V0. The Vcom and V0 are determined by resistance division by the resistor element 246 (resistance value Rr) and the storage element 241 (resistance value R0 or R1). Therefore, if the memory cell 221 has the data "0", Vp0=Vcom+(V0−Vcom)×R0/(R0+Rr). If the memory cell 221 has the data "1", Vp1=Vcom+(V0−Vcom)×R1/(R1+Rr). Accordingly, Vref is selected so as to be between Vp0 and Vp1 in FIG. 8B and a point of change of the clocked inverter is selected so as to be between Vp0 and Vp1 in FIG. 8C. Thus, Lo/Hi (or Hi/Lo) is outputted as an output potential Vout in accordance with the data "0"/"1", thereby carrying out data reading.

For example, the differential amplifier is operated at Vdd=3 V, and the Vcom is set to be 0 V, the V0 is set to be 3 V, and the Vref is set to be 1.5 V. If R0/Rr=Rr/R1=9 and the on resistance of the thin film transistor 240 is ignorable, Vp0 is 2.7 V and Hi is outputted as Vout when the data of the memory cell is "0", while Vp1 is 0.3 V and Lo is outputted as Vout when the data of the memory cell is "1". Thus, data reading from the memory cell can be carried out.

According to the above method, the data reading is carried out by the voltage value using the difference in the resistance value and the resistance division of the storage element 241. The reading method is not limited to this method. For example, in addition to the method using the difference in the electrical resistance, a reading method using a difference in a current value is also applicable. Moreover, in the case where the electrical characteristic of the memory cell has a diode characteristic in which threshold voltage is different between the data "0" and "1", reading may be carried out by using a difference in the threshold voltage.

This embodiment can be freely combined with the above embodiment modes.

By applying the present invention, separation is possible at an interface of the separation layer instead of the layer containing an organic compound of the storage element. Therefore, it is possible to separate the layer having the storage element formed over the heat-resistant substrate and provide the layer over a flexible substrate. By applying the present invention, it is possible to write (additionally record) data at a time other than during manufacturing a chip but impossible to rewrite the data. Thus, a semiconductor device capable of preventing forgery due to rewriting can be provided. Moreover, since the semiconductor device of the present invention has a storage element having a simple structure in which a layer containing an organic compound is sandwiched between a pair of conductive layers, the semiconductor device can be inexpensive.

Embodiment 2

This embodiment will describe a method for manufacturing a semiconductor device capable of reading and writing data without contact, with reference to FIGS. 12A to 12D.

Figure 12A:
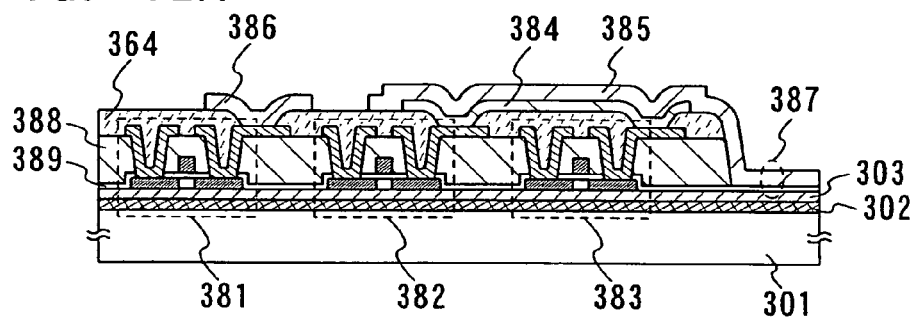
FIGS. 12A to 12D are cross-sectional views showing manufacturing steps of a semiconductor device of the present invention.

FIG. 12A is a cross-sectional view showing a memory cell array of a semiconductor device capable of reading and writing data without contact. Peripheral circuits such as a bit line driver circuit, a word line driver circuit, and an interface are omitted.

As shown in FIG. 12A, the separation layer 302 is formed in 30 nm thick over the substrate 301 and the insulating layer 303 is formed over the separation layer 302, similarly to Embodiment 1. Next, TFTs 381 to 383 are formed over the insulating layer 303. Here, the TFT 381 is connected to a conductive layer functioning as an antenna, while the TFTs 382 and 383 are connected to storage elements.

The interlayer insulating layer for insulating gate electrodes and source and drain electrodes of the TFTs 381 to 383 is also formed by using an organic insulating layer 388, similarly to Embodiment 1. Therefore, a part of the organic insulating layer 388 is removed so that a gate insulating layer 389 of the TFTs is exposed. Thus, a region 387 is formed where the gate insulating layer 389 of the inorganic insulating layer is in contact with a second electrode layer 385 formed by a metal layer.

Next, the organic insulating layer 364 is formed over the TFTs 361 to 363, similarly to Embodiment 1. Subsequently, a layer 384 containing an organic compound is formed over the organic insulating layer 364 and the exposed portions of the source or drain electrodes of the TFTs and the second electrode layer 385 is formed over the layer 384 containing an organic compound. At the same time, a conductive layer 386 functioning as an antenna is formed. It is to be noted that the second electrode layer 385 is in contact with the layer 384 containing an organic compound and the gate insulating layer 389. The organic insulating layer 364, the layer 384 containing an organic compound, and the second electrode layer 385 can be formed similarly to the organic insulating layer 310, the layer 311 containing an organic compound, and the second electrode layer 312 which are shown in Embodiment 1.

Here, the second electrode layer 385 is formed so that the region 387 where the gate insulating layer 389 is in contact with the second electrode layer 385 is formed. In the region where the gate insulating layer 389 is in contact with the second electrode layer 385, the adhesion between the gate insulating layer 389 and the second electrode layer 385 is so high that separation does not occur between the layer 384 containing an organic compound and the second electrode layer 385 in a later separation step but the separation layer and the insulating layer can be separated from each other with high yield.

Figure 12B:
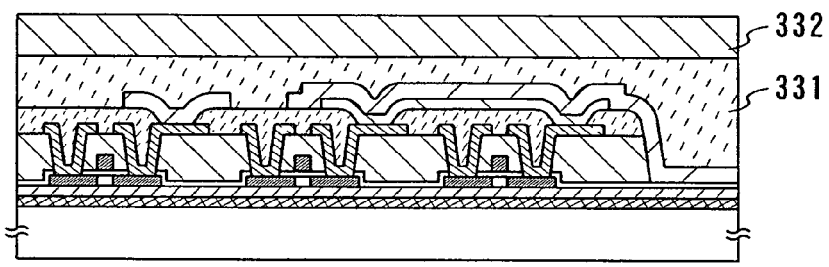
Figure 12C:
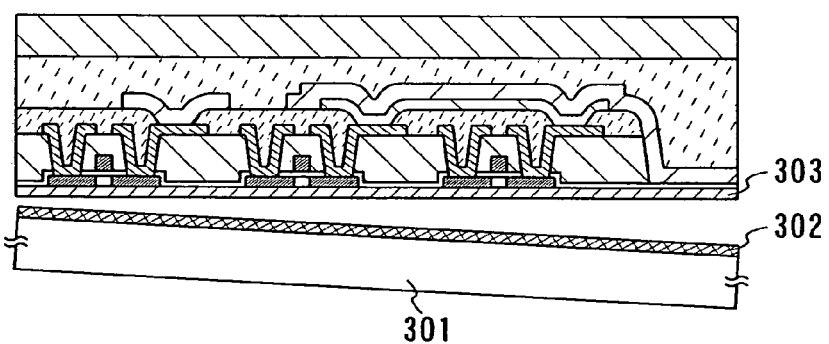

Next, as shown in FIG. 12B, after forming the insulating layer 331 over the second electrode layer, similarly to Embodiment 1, a plastic film 332 having an adhesive layer is attached over the insulating layer 331.

Figure 12D:
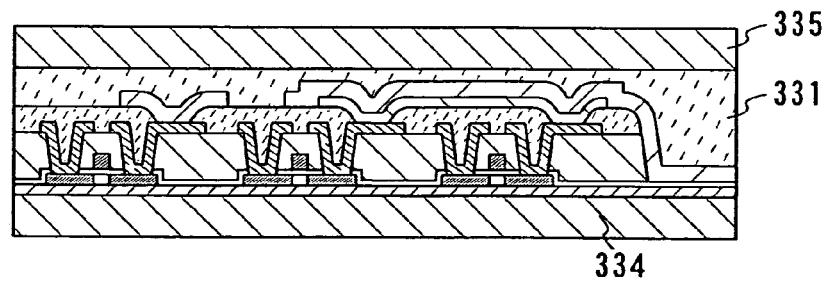

Hereinafter, since the separation step shown in FIG. 12D and the attaching of the substrate 109 shown in FIG. 12E are similar to those in Embodiment 1, the description thereof is omitted here.

By the aforementioned steps, a semiconductor device capable of reading and writing data without contact can be formed over a plastic film. Any of Embodiment Modes 1 to 4 can be applied to this embodiment.

Embodiment 3

With reference to FIGS. 13A to 13E, this embodiment will describe a method for manufacturing a semiconductor device capable of reading and writing data without contact, which is different from Embodiment 2.

Figure 13A:
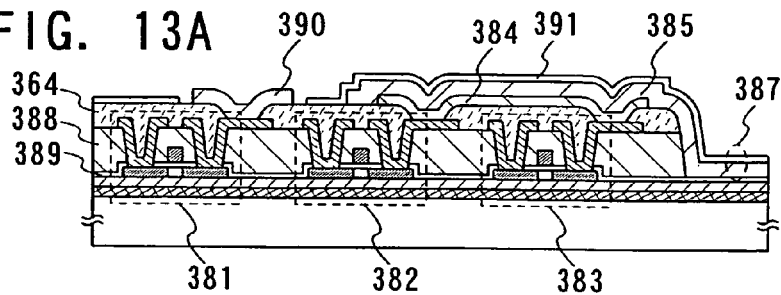
FIGS. 13A to 13E are cross-sectional views describing manufacturing steps of a semiconductor device of the present invention.

As shown in FIG. 13A, the separation layer 302 is formed in 30 nm thick over the substrate 301 and the insulating layer 303 is formed over the separation layer 302, similarly to Embodiment 1. Next, the TFTs 381 to 383 are formed over the insulating layer 303.

Next, the organic insulating layer 364 is formed over the TFTs 381 to 383, similarly to Embodiment 1. Subsequently, the layer 384 containing an organic compound is formed over the organic insulating layer 364 and the exposed portions of the source or drain electrodes of the TFTs, and the second electrode layer 385 is formed over the layer 384 containing an organic compound. At the same time, a connection terminal 390 is formed. The organic insulating layer 364, the layer 384 containing an organic compound, and the second electrode layer 385 can be formed similarly to the organic insulating layer 310, the layer 311 containing an organic compound, and the second electrode layer 312, which are shown in Embodiment 1, respectively.

Here, the second electrode layer 385 is formed so that the region 387 where the gate insulating layer 389 is in contact with the second electrode layer 385 is formed. The adhesion between the gate insulating layer 389 and the second electrode layer 385 is so high that the separation layer and the insulating layer can be separated from each other with high yield in a later separation step.

Figure 13B:
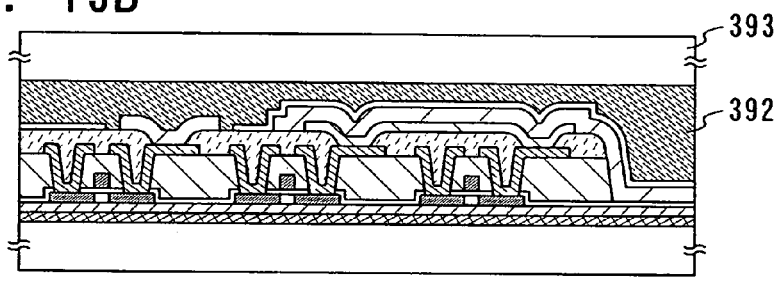

Next, a protective layer 391 is formed over the second electrode layer 385 so as to expose the connection terminal 390. Next, as shown in FIG. 13B, an adhesive layer 392 is formed over the protective layer 391 and a substrate 393 is attached to the adhesive layer 392. The adhesive layer 392 is formed by using a plastic adhesive such as an optical plastic adhesive, a thermoplastic adhesive, or a chemical plastic adhesive. The substrate 393 can be similar to the substrate 301. Here, an optical plastic resin is used as the adhesive layer 392 and the substrate 393 is a glass substrate.

Figure 13C:
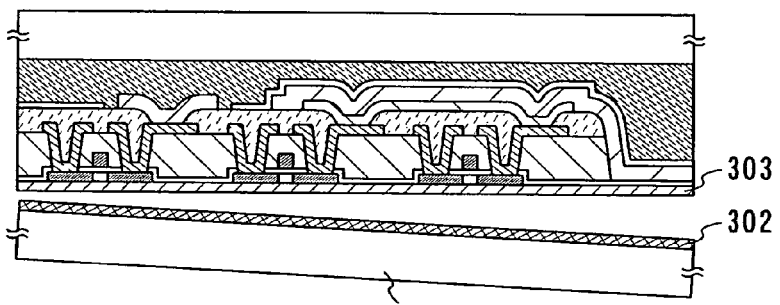
Figure 13D:
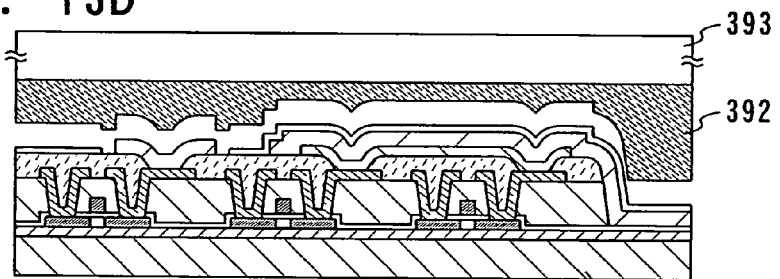

Next, as shown in FIG. 13C, separation is carried out at an interface between the separation layer 302 and the insulating layer 303.

Subsequently, as shown in FIG. 17D, a plastic film 394 having an adhesive layer is attached over the surface of the insulating layer 303 and is heated at 120 to 150° C. so that the adhesive layer of the plastic film 394 is plasticized. Thus, the plastic film 394 is attached to the surface of the insulating layer 303.

Next, the adhesive layer 392 is plasticized to remove the substrate 393 and the adhesive layer 392. Here, the adhesive layer 392 is irradiated with UV light to plasticize the adhesive layer, thereby removing the substrate 393.

Figure 13E:
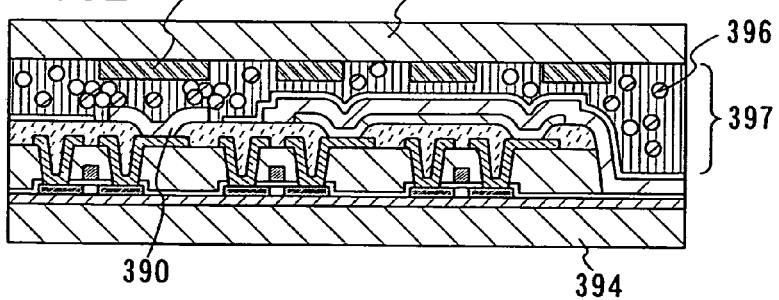

Then, as shown in FIG. 13E, the substrate having the TFTs and the storage element and a substrate 399 where the conductive layer 398 functioning as an antenna is provided are attached to each other by using an anisotropic conductive film or an anisotropic conductive adhesive. Here, the connection terminal 390 and the conductive layer 398 functioning as an antenna are electrically connected to each other by using conductive particles 396 in an anisotropic conductive adhesive 397. Since the second electrode layer 385 is protected by the protective layer 391, the second electrode layer 385 and the conductive layer 398 are not electrically connected to each other.

By the aforementioned steps, a semiconductor device capable of reading and writing data without contact can be formed over a plastic film.

Any of Embodiment Modes 1 to 4 can be applied to this embodiment.

Embodiment 4

Figure 14A:
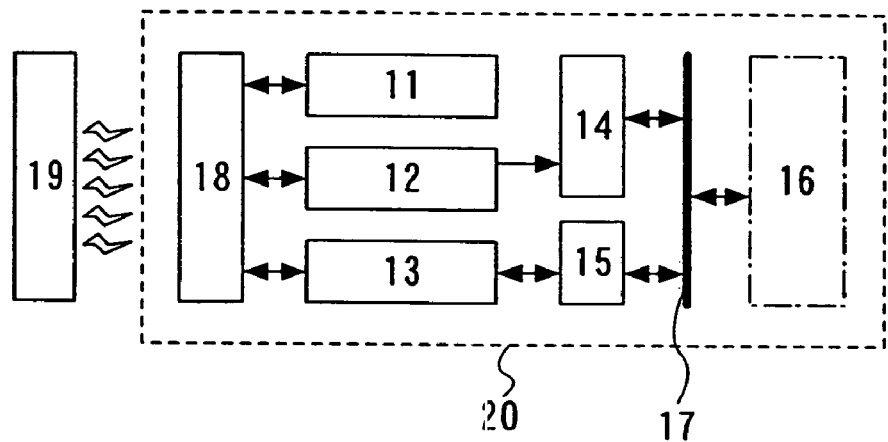
FIGS. 14A to 14C show semiconductor devices of the present invention.

Here, a structure of a semiconductor device having the elements shown in Embodiments 2 and 3 will be described with reference to FIGS. 14A to 14C. As shown in FIG. 14A, a semiconductor device 20 according to the present invention has a function to send and receive data without contact and includes a power source circuit 11, a clock generating circuit 12, a data modulating/demodulating circuit 13, a controlling circuit 14 for controlling another circuit, an interface circuit 15, a storage circuit 16, a data bus 17, and an antenna 18.

Figure 14B:
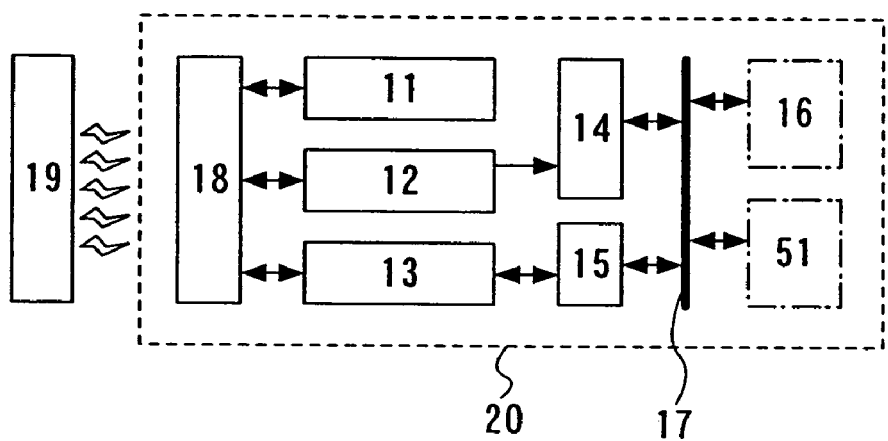

Further, as shown in FIG. 14B, the semiconductor device 20 of the present invention has a function to send and receive data without contact, and may have a central processing unit 51, in addition to the power source circuit 11, the clock generating circuit 12, the data modulating/demodulating circuit 13, the controlling circuit 14 which controls another circuit, the interface circuit 15, the storage circuit 16, the bus 17, and the antenna 18.

Figure 14C:
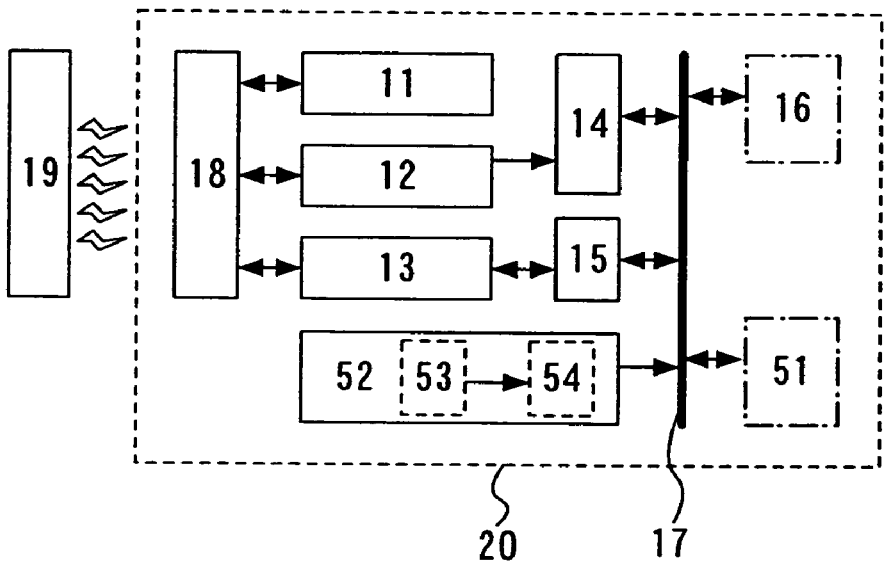

Moreover, as shown in FIG. 14C, the semiconductor device 20 of the present invention has a function to send and receive data without contact, and may have a detection portion 52 including a detection element 53 and a detection controlling circuit 54, in addition to the power source circuit 11, the clock generating circuit 12, the data modulating/demodulating circuit 13, the controlling circuit 14 which controls another circuit, the interface circuit 15, the storage circuit 16, the bus 17, the antenna 18, and the central processing unit 51.

In the semiconductor device of this embodiment, the detection portion 52 including the detection element 53 and the detection controlling circuit 54 and the like are formed in addition to the power source circuit 11, the clock generating circuit 12, the data modulating/demodulating circuit 13, the controlling circuit 14 which controls another circuit, the interface circuit 15, the storage circuit 16, the bus 17, the antenna 18, and the central processing unit 51 This structure makes it possible to form a compact and multifunctional semiconductor device.

The power source circuit 11 is a circuit generating various power sources to be supplied to the respective circuits in the semiconductor device 20 based on an alternating signal inputted from the antenna 18. The clock generating circuit 12 is a circuit generating various clock signals to be supplied to the respective circuits in the semiconductor device 20 based on an alternating signal inputted from the antenna 18. The data modulating/demodulating circuit 13 has a function to modulate/demodulate data to be sent to or received from a reader/writer 19. The controlling circuit 14 has a function to control the storage circuit 16. The antenna 18 has a function to send and receive an electromagnetic wave or an electric wave. The reader/writer 19 sends/receives data to/from the semiconductor device, controls the semiconductor device, and controls the process of the data sent to or received from the semiconductor device. The semiconductor device is not restricted by the above structure, and for example, another element such as a limiter circuit of power source voltage or hardware only for processing codes may be added.

The storage circuit 16 has one or more of elements selected from the storage elements shown in Embodiment Modes 1 to 4 and Embodiment Modes 1 and 2. The storage element which has the layer containing an organic compound can achieve downsizing, film thinning, and increasing in capacity at the same time; therefore, when the storage circuit 16 is provided by using the storage element which has the layer containing an organic compound, the reduction in size and weight of the semiconductor device can be achieved.

The detection portion 52 can detect temperature, pressure, flow rate, light, magnetism, sound wave, acceleration, humidity, a gas constituent, a liquid constituent, and other characteristics by a physical or chemical means. Moreover, the detection portion 52 has the detection element 53 for detecting a physical quantity or a chemical quantity and the detection controlling circuit 54 for converting the physical quantity or the chemical quantity detected by the detection element 53 into an appropriate signal such as an electric signal. As the detection element 53, it is possible to use a resistor element, a capacitively coupled element, an inductively coupled element, a photovoltaic element, a photoelectric conversion element, a thermo-electromotive force element, a transistor, a thermistor, a diode, or the like. The number of detection portions 52 may be more than one and, in such a case, it is possible to detect a plurality of physical quantities or chemical quantities simultaneously.

The physical quantity described here means temperature, pressure, flow rate, light, magnetism, sound wave, acceleration, humidity, and the like, while the chemical quantity means a chemical substance such as a gas constituent or a constituent included in a liquid such as an ion, or the like. In addition, an organic compound such as a particular biological substance included in blood, sweat, urine, or the like (for example, blood-sugar level in the blood) is also included. In particular, in the case of detecting the chemical amount, since a particular substance is to be selectively detected by necessity, a substance which selectively reacts with the substance to be detected is provided in advance in the detection element 53. For example, in the case of detecting a biological substance, it is preferable to fix, in a high molecular compound or the like, an enzyme, an antibody molecule, a microbial cell, or the like which selectively reacts with the biological substance to be detected by the detection element 53.

Figure 20A:
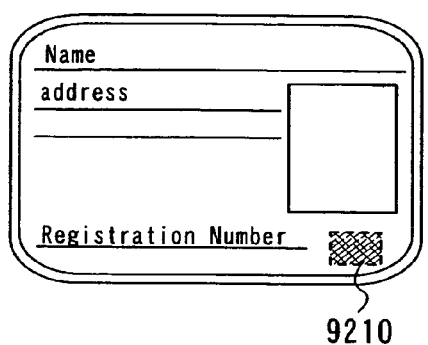
FIGS. 20A to 20F show usage of semiconductor devices of the present invention.
Figure 20B:
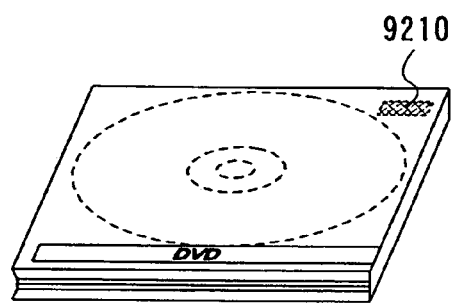
Figure 20C:
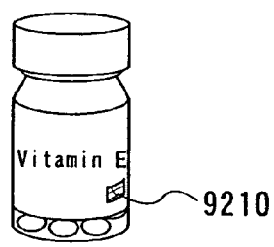
Figure 20D:
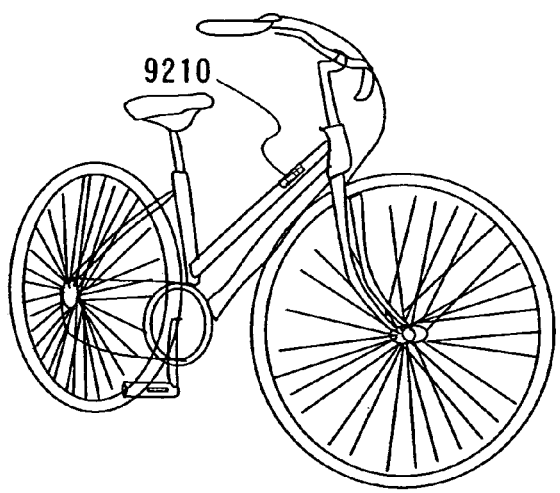
Figure 20E:
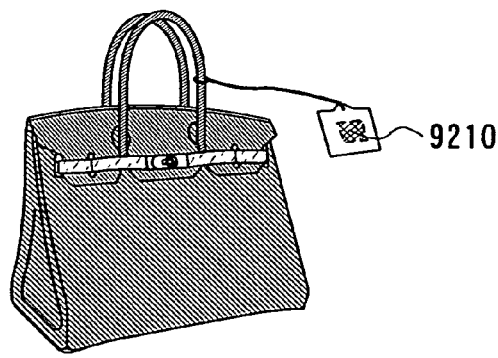
Figure 20F:
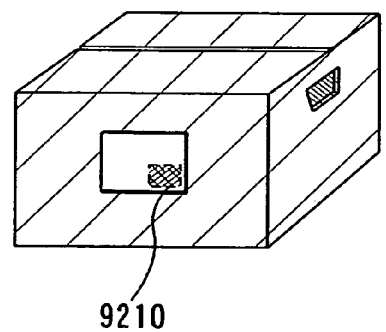

A semiconductor device functioning as a wireless chip can be formed according to the present invention. The wireless chip is applicable in a wide range. For example, the wireless chip can be applied to banknotes, coins, securities, bearer bonds, identification certificates (driver's license, certificate of residence, and the like, see FIG. 20A), containers for package (package paper, bottles, and the like, see FIG. 20C), recording media (DVD software, video tapes, and the like, see FIG. 20B), vehicles (bicycles and the like, see FIG. 20D), personal belongings (bags, glasses, and the like), foods, plants, animals, human bodies, clothes, commodities, electronic appliances, baggage tags (see FIGS. 20E and 20F), and the like. The electronic appliances include a liquid crystal display device, an EL (Electro Luminescence) display device, a television device (also referred to as simply a TV, a TV receiving machine, or a television receiving machine), a mobile phone, and the like.

The semiconductor device 20 of the present invention is fixed to a product by being mounted on a printed substrate, attaching the semiconductor device 20 to the surface of the product, or embedding the semiconductor device 20 inside the product. For example, if the product is a book, the semiconductor device 20 is fixed to the book by embedding it inside a paper, and if the product is a package made of an organic resin, the semiconductor device 20 is fixed to the package by embedding it inside the organic resin. Since the semiconductor device 20 of the present invention can be compact, thin, and lightweight, the design quality of the product itself is not degraded even after the device is fixed to the product. By providing the semiconductor device 20 to banknotes, coins, securities, bearer bonds, identification certificates, and the like, a certification function can be provided and the forgery can be prevented by using the certification function. Moreover, when the semiconductor device of the present invention is provided in containers for package, recording media, personal belongings, foods, clothes, commodities, electronic appliances, and the like, systems such as an inspection system can become more efficient.

Embodiment 5

This embodiment will describe steps of manufacturing a semiconductor device having a light-emitting element.

As shown in FIG. 15A, a separation layer 402 is formed over a substrate 401. In this embodiment, the substrate is formed with AN100. Over this glass substrate is formed the separation layer 402, which is a tungsten layer here (with a thickness of 10 to 200 nm, preferably 50 to 75 nm) by a sputtering method. Then, an insulating layer 403 is formed. Here, a silicon nitride oxide film is formed in 140 nm thick and a silicon oxynitride film is formed in 100 nm thick, by a CVD method.

Subsequently, p-channel TFTs 414 and 416 and an n-channel TFT 415 are formed over the insulating layer 403. A driver circuit is formed by the p-channel TFT 414 and the n-channel TFT 415. The p-channel TFT 416 functions as a driver element for driving the light-emitting element.

A first interlayer insulating layer 417 for insulating wires and gate electrodes of the TFTs 414 to 416 is formed by stacking silicon oxynitride, silicon nitride oxide, and an acrylic resin. Moreover, wires 418 to 423 connected to the semiconductor layers of the TFTs and a connection terminal 424 are formed over the first interlayer insulating layer 417. Here, a 100-nm-thick Ti film and a 700-nm-thick Al film, and a 100-nm-thick Ti film are continuously formed by a sputtering method and these films are selectively etched by using a resist mask which is formed by a photolithography step, thereby forming the wires 418 to 423 and the connection terminal 424. After that, the resist mask is removed.

Subsequently, a second interlayer insulating layer 425 is formed over the interlayer insulating layer 417, the wires 418 to 423, and the connection terminal 424. As the second interlayer insulating layer 425, an inorganic insulating film such as a silicon oxide film, a silicon nitride film, or a silicon oxynitride film can be used. These insulating films can be formed in a single-layer or multilayer structure. As a method for forming the inorganic insulating film, a sputtering method, an LPCVD method, a plasma CVD method, or the like may be used.

In this embodiment, a plasma CVD method is used, and the second interlayer insulating layer 425 is formed in 100 to 150 nm thick by using an inorganic insulating film.

Next, the second interlayer insulating layer 425 is selectively etched by using a resist mask formed by a photolithography step to form contact holes that reach the wire 423 of the driving TFT and the connection terminal 424. After that, the resist mask is removed.

Subsequently, a first electrode layer 426 to be connected to the wire 423 of the driving TFT and a conductive layer 430 to be connected to the connection terminal 424 are formed. The first electrode layer 426 and the conductive layer 430 are formed in such a way that after ITO containing silicon oxide is formed in 125 nm by a sputtering method, the ITO is selectively etched by using a resist mask formed by a photolithography step.

As is described in this embodiment, the formation of the second interlayer insulating layer 425 can prevent the TFTs of the driver circuit portion, the wires, and the like from being exposed and can protect the TFTs from contamination sources.

Next, an organic insulating layer 427 is formed to cover an end portion of the first electrode layer 426. Here, after applying and baking photosensitive polyimide, light-exposure and development are carried out, thereby forming the organic insulating layer 427 so that the driver circuit, the first electrode layer 426 in a pixel region, and the second interlayer insulating layer 425 in a periphery of the pixel region are exposed.

Next, a layer 428 containing a light-emitting substance is formed by an evaporation method over a part of the first electrode layer 426 and the organic insulating layer 427. The layer 428 containing a light-emitting substance is formed with an organic compound having a light-emitting property. Moreover, a red-light-emitting pixel, a blue-light-emitting pixel, and a green-light-emitting pixel are formed by using a red-light-emitting organic compound, a blue-light-emitting organic compound, and a green-light-emitting organic compound respectively for the layer 363 containing an organic compound.

Here, the layer containing a red-light-emitting organic compound is formed by stacking DNTPD formed in 50 nm thick, NPB formed in 10 nm thick, NPB doped with bis[2,3-bis(4-fluorophenyl)quinoquixalinato]iridium(acetylacetonate) (abbreviated to Ir(Fdpq)$_2$(acac)) which is formed in 30 nm thick, Alq$_3$ formed in 60 nm thick, and LiF formed in 1 nm thick.

The layer containing a green-light-emitting organic compound is formed by stacking DNTPD formed in 50 nm thick, NPB formed in 10 nm thick, Alq$_3$ doped with coumarin 545T (C545T) which is formed in 40 nm thick, Alq$_3$ formed in 60 nm thick, and LiF formed in 1 nm thick are stacked.

The layer containing a blue-light-emitting organic compound is formed by stacking DNTPD formed in 50 nm thick, NPB formed in 10 nm thick, 9-[4-(N-carbazolyl)]phenyl-10-phenylanthracene (abbreviated to CzPA) doped with 2,5,8,11-tetra(tert-butyl)perylene (abbreviated to TBP) which is formed in 30 nm thick, Alq$_3$ formed in 60 nm thick, and LiF formed in 1 nm thick are stacked.

Moreover, a white-light-emitting pixel may be formed by using a white light-emitting organic compound. By providing a white-light-emitting pixel, power consumption can be reduced.

Next, as shown in FIG. 15B, a second electrode layer 431 is formed over the layer 428 containing a light-emitting substance, the organic insulating layer 427, and the second interlayer insulating layer 425. Here, an Al film is formed in 200 nm thick by an evaporation method. At this time, a region 432 is formed where the second electrode layer 431 is in contact with the second interlayer insulating layer 425 formed by using an inorganic compound. In the region 432 where the second electrode layer 431 is in contact with the second interlayer insulating layer 425 formed by using an inorganic compound, the adhesion therebetween is so high that separation is possible between the separation layer 302 and the insulating layer 303 instead of between the layer 428 containing a light-emitting substance and the second electrode layer 431 in a later separation step.

Next, as shown in FIG. 15C, a protective layer 441 is formed over the second electrode layer 431. The protective layer 441 is formed to prevent the intrusion of moisture, oxygen, and the like into the light-emitting element. The protective layer 441 is preferably formed by a thin-film forming method such as a plasma CVD method or a sputtering method by using silicon nitride, silicon oxide, silicon nitride oxide, silicon oxynitride, aluminum oxynitride, aluminum oxide, diamond-like carbon (DLC), carbon containing nitrogen (CN), or other insulating materials.

Subsequently, an insulating layer 442 is formed over the protective layer 441. Here, the insulating layer 442 is formed with an epoxy resin by applying and baking a composition. Next, a plastic film 443 is attached over the insulating layer 442. Then, after attaching a minimally sticky tape (not shown) on the surface of the substrate 401, a heat treatment is carried out at 120 to 150° C. to plasticize the adhesive layer of the plastic film 443. Thus, the plastic film 443 is attached to the insulating layer 442.

Next, the substrate 401 is arranged on the surface of a flat portion. Then, a roller (not shown) having a sticky layer is fixed to the surface of the plastic film 443 while applying pressure thereto, and separation is carried out at an interface between the separation layer 402 and the insulating layer 403 as shown in FIG. 16A.

Subsequently, as shown in FIG. 16B, a plastic film 451 having an adhesive layer is attached over the surface of the insulating layer 403, and a heat treatment is carried out at 120 to 150° C. to plasticize the adhesive layer of the plastic film 451. Thus, the plastic film 451 is attached to the surface of the insulating layer 403.

Next, an FPC 454 is attached to the conductive layer 430 which is in contact with the connection terminal 424 by using an anisotropic conductive layer 453.

By the aforementioned steps, a semiconductor device having an active matrix light-emitting element can be formed over the plastic film.

Figure 17:
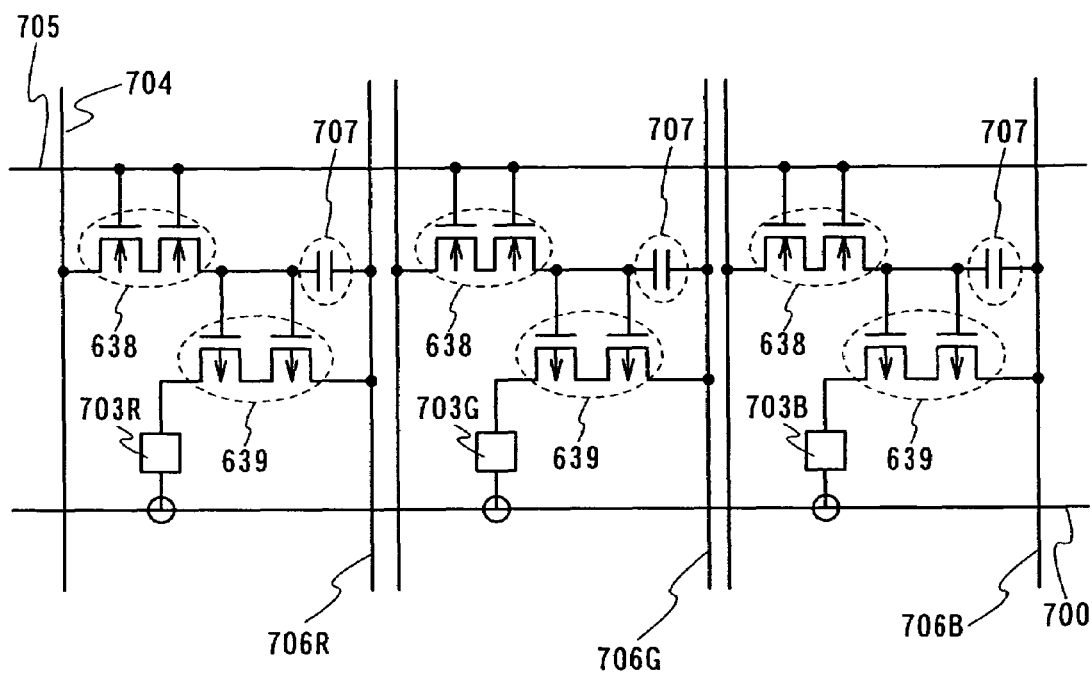
FIG. 17 shows an equivalent circuit of a semiconductor device of the present invention.

In this embodiment, an equivalent circuit diagram in a pixel in the case of full-color display is shown in FIG. 17. In FIG. 17, a TFT 639 surrounded by a dotted line corresponds to a driving TFT 603.

In the pixel expressing a red color, a drain region of the driving TFT 639 is connected to an OLED 703R for emitting red light while a source region thereof is provided with an anode side power source line (R) 706R. The OLED 703R is provided with a cathode side power source line 700. The switching TFT 638 is connected to a gate wire 705 and a gate electrode of the driving TFT 639 is connected to a drain region of the switching TFT 638. The drain region of the switching TFT 638 is connected to a capacitor element 707 connected to the anode side power source line (R) 706(R).

In the pixel expressing a green color, a drain region of the driving TFT is connected to an OLED 703G for emitting green light while a source region thereof is provided with an anode side power source line (G) 706G. The switching TFT 638 is connected to the gate wire 705 and the gate electrode of the driving TFT 639 is connected to the drain region of the switching TFT 638. The drain region of the switching TFT 638 is connected to the capacitor element 707 connected to the anode side power source line (G) 706(G).

In the pixel expressing a blue color, a drain region of the driving TFT is connected to an OLED 703B for emitting blue light while a source region thereof is provided with an anode side power source line (B) 706B. The switching TFT 638 is connected to the gate wire 705 and the gate electrode of the driving TFT 639 is connected to the drain region of the switching TFT 638. The drain region of the switching TFT 638 is connected to the capacitor element 707 connected to the anode side power source line (B) 706(B).

Different voltages depending on EL materials are applied respectively to the pixels with different colors.

Here, the source wire 704 is formed in parallel to the anode side power source lines 706R, 706G, and 706B; however, the present invention is not limited to this. The gate wire 705 may be formed in parallel to the anode side power source lines 706R, 706G, and 706B. Moreover, the driving TFT 639 may have a multigate electrode structure.

In the light-emitting device, the driving method of screen display is not particularly restricted. For example, a dot-sequential driving method, a line-sequential driving method, a plane-sequential driving method, or the like may be used. Typically, the line sequential driving method is used, and may be appropriately combined with a time-division grayscale driving method or an area grayscale driving method. In addition, a video signal to be inputted into a source line of the light emitting device may be an analog signal or a digital signal. A driving circuit or the like may be appropriately designed in accordance with the video signal.

Further, in a light-emitting device using a digital video signal, there are two kinds of driving systems in which video signals inputted into a pixel are ones with constant voltage (CV) and in which video signals inputted into a pixel are ones with constant current (CC). Further, as for the driving system using video signals with constant voltage (CV), there are two kinds of systems in which voltage applied to a light emitting element is constant (CVCV), and in which current applied to a light emitting element is constant (CVCC). In addition, as for the driving system using video signals with constant current (CC), there are two kinds of systems in which voltage applied to a light emitting element is constant (CCCV), and in which current applied to a light emitting element is constant (CCCC).

In the light-emitting device, a protective circuit for preventing electrostatic breakdown (such as a protective diode) may be provided.

By the aforementioned steps, a semiconductor device having an active matrix light-emitting element provided over a plastic film can be manufactured.

This embodiment can be freely combined with any of Embodiment Modes 1 to 4.

Embodiment 6

Next, description is made of an example in which the EL display panel described in Embodiment 5 has an FPC or a driver IC mounted thereon. Here, a chip-like driver circuit formed by TFTs is called a driver IC.

Figure 18A:
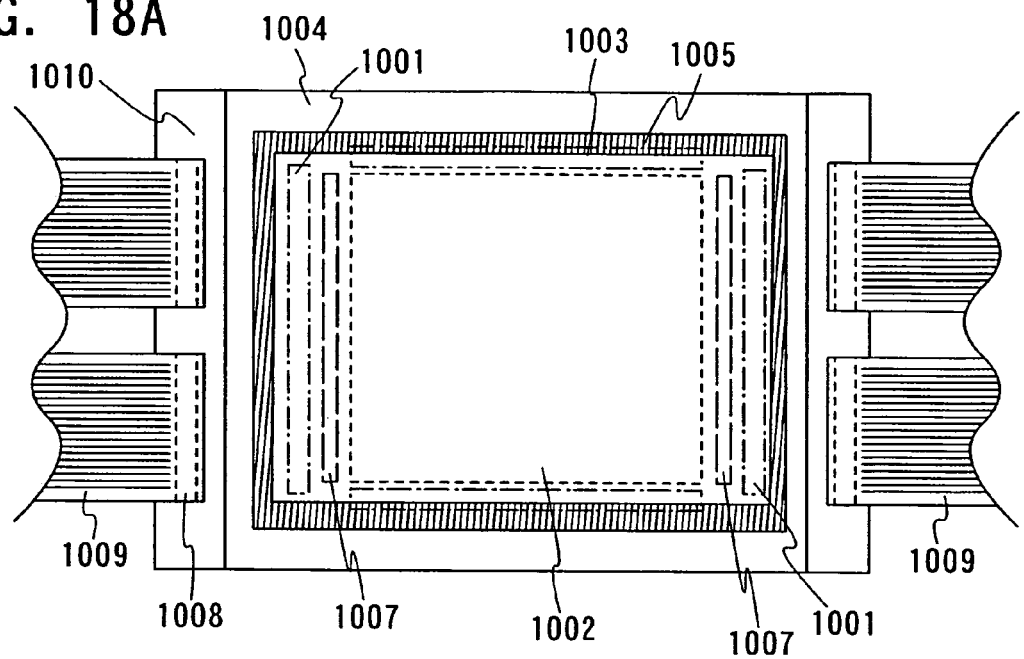
FIGS. 18A and 18B are top views showing structures of semiconductor devices of the present invention.

FIG. 18A is a top view showing an example of a light-emitting device in which FPCs 1009 are attached to four terminal portions 1008. Over a substrate 1010, a pixel portion 1002 including a light-emitting element and a TFT, a gate side driver circuit 1003 including a TFT, and a first driver circuit 1001 including a TFT are formed. An active layer of the TFT is formed using a semiconductor film having a crystal structure, and these circuits can be formed over one substrate. Therefore, an EL display panel in which a system-on-panel is achieved can be manufactured.

Further, connection regions 1007 are provided at two locations so as to sandwich the pixel portion in order that a second electrode (cathode) of the light-emitting element contacts the wire of the lower layer. A first electrode (anode) of the light-emitting element is electrically connected to the TFT provided in the pixel portion.

A sealing substrate 1004 is fixed to the substrate 1010 by a sealing material 1005 surrounding the pixel portion and the driver circuit and a filling material surrounded by the sealing material 1005. Further, a filling material containing a transparent dry agent may be used. Further, a dry agent may be disposed in a region not overlapping the pixel portion.

Although a part of the sealing material 1005 overlaps with the gate side driver circuit 1003 including a TFT in this embodiment, the sealing material 1005 may be provided so as to surround the periphery of a display region. In other words, the sealing material may be provided so as not to overlap with the gate side driver circuit 1003.

FIG. 18A shows a structure which is preferable for a light-emitting device having a relatively large size (for example, 4.3 inch diagonal). Meanwhile, FIG. 18B shows an example of employing a COG method which is preferable for a small size with a narrow frame (for example, 1.5 inch diagonal).

Figure 18B:
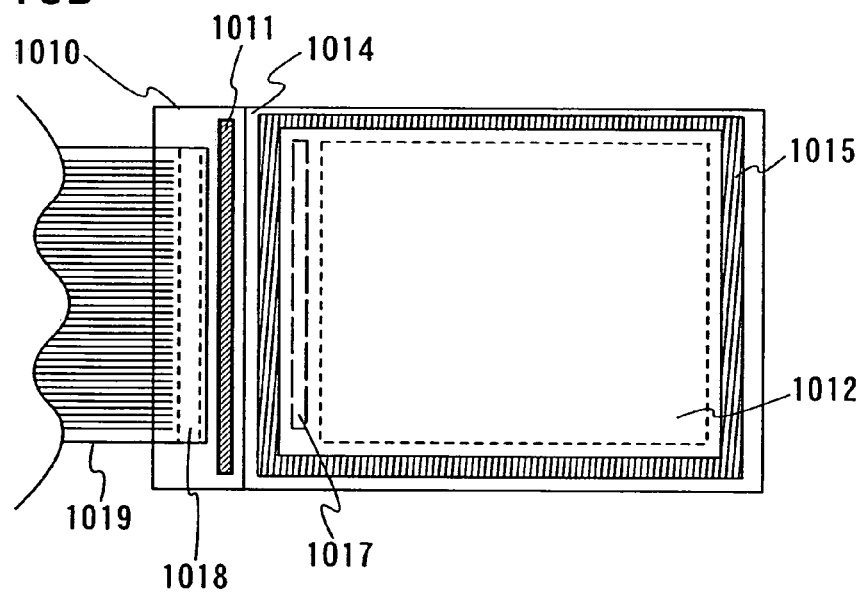

In FIG. 18B, a driver IC 1011 is mounted onto the substrate 1010, and an FPC 1019 is mounted onto a terminal portion 1018 disposed at an end of the driver IC. A plurality of the driver ICs 1011 to be mounted are preferably formed over a rectangular substrate having a side of 300 mm to 1000 mm. That is to say, a plurality of circuit patterns having a driver circuit portion and an input/output terminal as a unit may be formed over the substrate, and each circuit pattern may be taken out by dividing the substrate at the last. The driver IC may have a rectangular shape whose long side has a length of 15 to 80 mm and short side has a length of 1 to 6 mm in consideration of the length of the pixel portion on a side or the pixel pitch. The length of the long side of the driver IC may be equal to one side of the pixel portion or a sum of the length of one side of the pixel portion and the length of one side of the driver circuit.

The speriority of the outside dimension of the driver IC to the IC chip lies in the length of the long side. When the driver IC has a long side of 15 to 80 mm, the number required for mounting in accordance with the pixel portion is fewer than that in the case of using the IC chip, thereby increasing the yield of the production. When the driver IC is formed over a glass substrate, the shape of the substrate used as a base material is not limited and the productivity is not lowered. This is a great advantage in comparison with the case of taking IC chips from a circular silicon wafer.

Further, a TAB method is also applicable. In a TAB method, a plurality of tapes may be attached and the driver ICs may be mounted to the tapes. Similarly to the COG method, a single driver IC may be mounted to a single tape. In such a case, a metal chip or the like for fixing the driver IC is preferably attached together in point of the strength.

A connection region 1017 between the pixel portion 1102 and the driver IC 1011 is provided so that the second electrode layer in the light-emitting element is in contact with the wire of the lower layer. The first electrode of the light-emitting element is electrically connected to the TFT provided in the pixel portion.

Moreover, the sealing substrate 1014 is fixed to the substrate 1010 by the sealing material 1015 surrounding the pixel portion 1012 and a filling material surrounded by the sealing material 1015.

The driver IC may be replaced by an IC chip formed by a Si chip.

In the case of using an amorphous semiconductor film as an active layer of a TFT in the pixel portion, it is difficult to form the driver circuit over one substrate. Therefore, even if the size is large, the structure is one shown in FIG. 18B.

As thus described, various electronic appliances can be completed by using the structure of the light-emitting element described in Embodiment 5.

Embodiment 7

Figure 19:
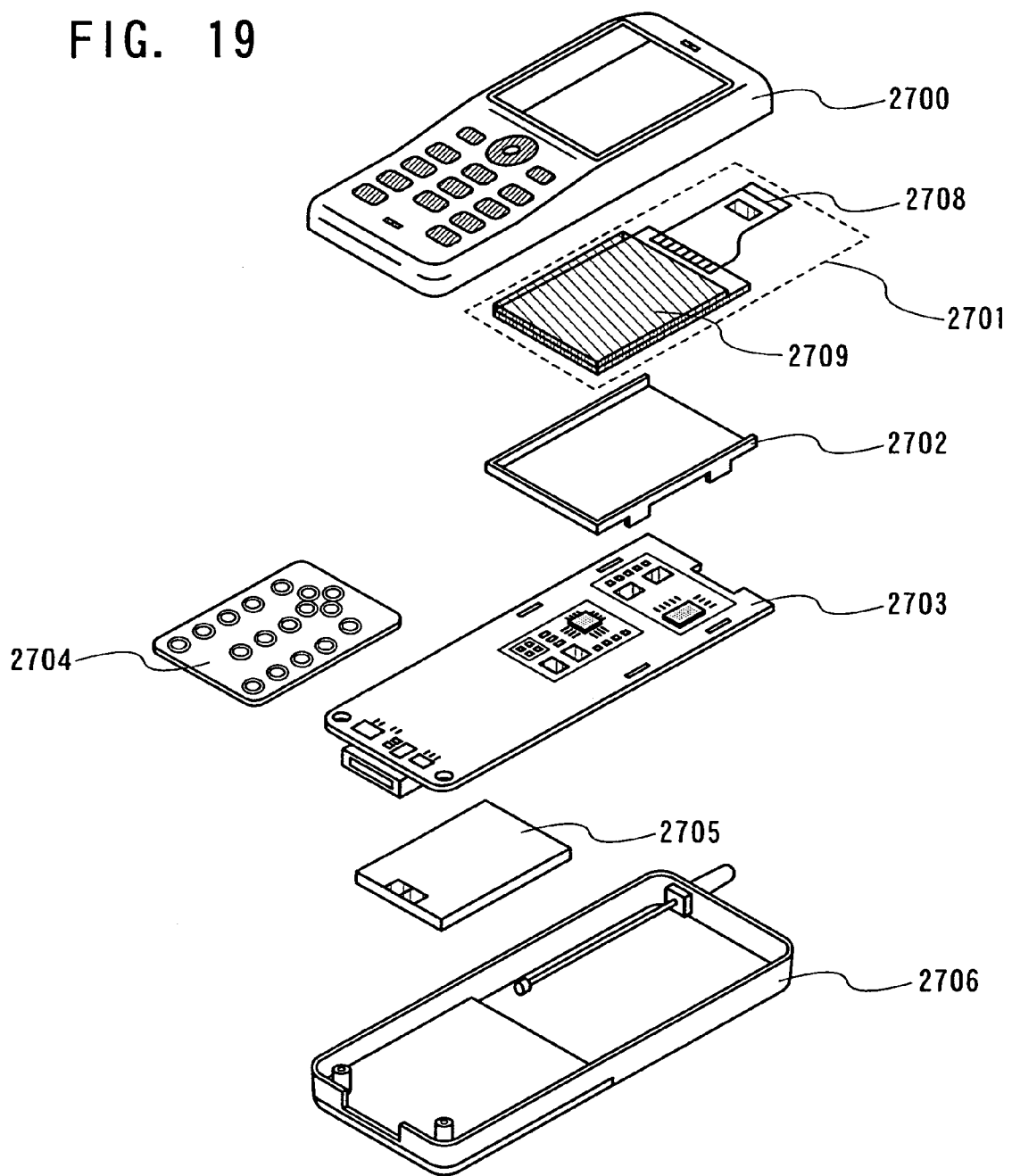
FIG. 19 is a development view showing a structure of a semiconductor device of the present invention.

An aspect of an electronic appliance with a semiconductor device of the present invention mounted will be described with reference to a drawing. An electronic appliance to be described here is a mobile phone, which includes cases 2700 and 2706, a panel 2701, a housing 2702, a print wiring substrate 2703, operation buttons 2704, and a battery 2705 (see FIG. 19). The panel 2701 is detachably incorporated into the housing 2702, and the housing 2702 is fitted into the print wiring substrate 2703. The shape and size of the housing 2702 is appropriately modified in accordance with an electronic appliance to which the panel 2701 is to be incorporated. The print wiring substrate 2703 has a plurality of packaged semiconductor devices mounted. A semiconductor device of the present invention can be used as one of the packaged semiconductor devices. The plurality of semiconductor devices mounted on the print wiring substrate 2703 has any function of a controller, a central processing unit (CPU), a memory, a power source circuit, an audio processing circuit, a sending/receiving circuit, and the like.

The panel 2701 is connected to the print wiring substrate 2703 through a connection film 2708. The panel 2701, the housing 2702, and the print wiring substrate 2703 are included inside the cases 2700 and 2706 together with the operation buttons 2704 and the battery 2705. A pixel region 2709 in the panel 2701 is provided so as to be observed from an opening window provided in the case 2700. The semiconductor devices shown in Embodiments 5 and 6 can be used for the panel 2701.

As aforementioned, the semiconductor device of the present invention has advantages of its compactness, thinness, and lightweight. These advantages allow efficient usage of limited space in the cases 2700 and 2706 of the electronic appliance.

It is to be noted that the shapes of the cases 2700 and 2706 are just an example of an exterior shape of the mobile phone, and the electronic appliance of the present invention can be modified into various modes in accordance with the function and intended purpose.

This application is based on Japanese Patent Application serial no. 2005-252881 filed in Japan Patent Office on Aug. 31, 2005, the entire contents of which are hereby incorporated by reference.

What is claimed is:

1. A method for manufacturing a semiconductor device, comprising:
    forming a separation layer over a substrate;
    forming an element-forming layer by the steps comprising:
        forming a thin film transistor over the separation layer;
        forming an inorganic insulating layer over a gate electrode of the thin film transistor;
        forming a wire of the thin film transistor over the inorganic insulating layer;
        forming a first electrode layer to be connected to the wire of the thin film transistor over the inorganic insulating layer;
        forming an organic insulating layer covering an end portion of the first electrode layer;
        forming a layer containing an organic compound over a part of the organic insulating layer and an exposed portion of the first electrode layer; and
        forming a second electrode layer which is provided over the layer containing an organic compound and is in contact with the layer containing an organic compound and the inorganic insulating layer; and
    attaching a first flexible substrate over the second electrode layer; and
    separating the substrate and the element-forming layer from each other at the separation layer so that the element-forming layer is supported by the first flexible substrate.

2. The method for manufacturing a semiconductor device according to claim 1,
    wherein the first electrode layer, the layer containing an organic compound, and the second electrode layer constitute parts of a storage element.

3. The method for manufacturing a semiconductor device according to claim 1,
    wherein the first electrode layer, the layer containing an organic compound, and the second electrode layer constitute parts of a light-emitting element.

4. The method for manufacturing a semiconductor device according to claim 1,
    wherein after separating the element-forming layer and the separation layer from each other, the element-forming layer is attached to a second flexible substrate.

5. A method for manufacturing a semiconductor device, comprising:
    forming a separation layer over a substrate;
    forming an element-forming layer by the steps comprising:
        forming a semiconductor layer over the separation layer;
        forming a gate insulating layer by an inorganic insulator over the semiconductor layer;
        forming a gate electrode over the gate insulating layer;
        forming an organic insulating layer over the gate electrode, partially exposing the semiconductor layer and the gate insulating layer by partially removing the organic insulating layer;
        forming a wire to be connected to the semiconductor layer over the organic insulating layer;
        forming a first electrode layer to be connected to the wire;
        forming an organic insulating layer covering an end portion of the first electrode layer;
        forming a layer containing an organic compound over a part of the organic insulating layer and an exposed portion of the first electrode layer, and
        forming a second electrode layer which is provided over the layer containing an organic compound and is in contact with the layer containing an organic compound and the gate insulating layer; and
    attaching a first flexible substrate over the second electrode layer; and separating the substrate from the element-forming layer from each other at the separation layer so that the element-forming layer is supported by the first flexible substrate.

6. The method for manufacturing a semiconductor device according to claim 5,
wherein the first electrode layer, the layer containing an organic compound, and the second electrode layer constitute parts of a storage element.

7. The method for manufacturing a semiconductor device according to claim 5,
wherein the first electrode layer, the layer containing an organic compound, and the second electrode layer constitute parts of a light-emitting element.

8. The method for manufacturing a semiconductor device according to claim 5,
wherein after separating the element-forming layer and the separation layer from each other, the element-forming layer is attached to a second flexible substrate.

9. A method for manufacturing a semiconductor device, comprising:
forming a separation layer over a substrate;
forming an element-forming layer by the steps comprising:
  forming an insulating layer over the separation layer;
  forming a semiconductor layer over the insulating layer;
  forming a gate insulating layer by an inorganic insulator over the semiconductor layer;
  forming a gate electrode and a first conductive layer over the gate insulating layer;
  forming an organic insulating layer over the gate electrode and the first conductive layer;
  partially exposing the semiconductor layer and the first conductive layer by selectively removing the organic insulating layer;
  forming a wire to be connected to the semiconductor layer over the organic insulating layer; and
  forming a second conductive layer to be connected to the first conductive layer;
  forming a first electrode layer to be connected to the wire and forming a third conductive layer to be connected to the second conductive layer;
  forming an organic insulating layer covering end portions of the first electrode layer and the third conductive layer;
  forming a layer containing an organic compound over apart of the organic insulating layer and an exposed portion of the first electrode layer; and
  forming a second electrode layer which is provided over the layer containing an organic compound and is in contact with the layer containing an organic compound and at least one of the first to third conductive layers; and
attaching a first flexible substrate over the second electrode layer; and
separating the substrate and the element-forming layer from each other at the separation layer so that the element-forming layer is supported by the first flexible substrate.

10. The method for manufacturing a semiconductor device according to claim 9,
wherein the first electrode layer, the layer containing an organic compound, and the second electrode layer constitute parts of a storage element.

11. The method for manufacturing a semiconductor device according to claim 9,
wherein the first electrode layer, the layer containing an organic compound, and the second electrode layer constitute parts of a light-emitting element.

12. The method for manufacturing a semiconductor device according to claim 9,
wherein after separating the element-forming layer and the separation layer from each other, the element-forming layer is attached to a second flexible substrate.

13. A method for manufacturing a semiconductor device, comprising:
forming a separation layer over a substrate;
forming an element-forming layer by the steps comprising:
  forming a semiconductor layer over the separation layer;
  forming a gate insulating layer by an inorganic insulator over the semiconductor layer;
  forming a gate electrode over the gate insulating layer;
  forming an organic insulating layer over the gate electrode, partially exposing the semiconductor layer and the gate insulating layer by partially removing the organic insulating layer;
  forming a wire to be connected to the semiconductor layer over the organic insulating layer;
  forming a first electrode layer to be connected to the wire;
  forming an organic insulating layer covering an end portion of the first electrode layer;
  forming a layer containing an organic compound over a part of the organic insulating layer and an exposed portion of the first electrode layer, and
  forming a second electrode layer which is provided over the layer containing an organic compound and is in contact with the layer containing an organic compound and the gate insulating layer; and
attaching a first flexible substrate over the second electrode layer; and
separating the substrate from the element-forming layer from each other at the separation layer so that the element-forming layer is supported by the first flexible substrate.

14. The method for manufacturing a semiconductor device according to claim 13,
wherein the first electrode layer, the layer containing an organic compound, and the second electrode layer constitute parts of a storage element.

15. The method for manufacturing a semiconductor device according to claim 13,
wherein the first electrode layer, the layer containing an organic compound, and the second electrode layer constitute parts of a light-emitting element.

16. The method for manufacturing a semiconductor device according to claim 13,
wherein after separating the element-forming layer and the separation layer from each other, the element-forming layer is attached to a second flexible substrate.

17. A method for manufacturing a semiconductor device, comprising:
forming a separation layer over a substrate;
forming an element-forming layer by the steps comprising:
  forming an insulating layer over the separation layer;
  forming a semiconductor layer over the insulating layer;
  forming a gate insulating layer by an inorganic insulator over the semiconductor layer;
  forming a gate electrode and a first conductive layer over the gate insulating layer;
  forming an organic insulating layer over the gate electrode and the first conductive layer;

partially exposing the semiconductor layer and the first conductive layer by selectively removing the organic insulating layer;

forming a wire to be connected to the semiconductor layer over the organic insulating layer; and forming a second conductive layer to be connected to the first conductive layer;

forming a first electrode layer to be connected to the wire and forming a third conductive layer to be connected to the second conductive layer;

forming an organic insulating layer covering end portions of the first electrode layer and the third conductive layer;

forming a layer containing an organic compound over a part of the organic insulating layer and an exposed portion of the first electrode layer; and forming a second electrode layer which is provided over the layer containing an organic compound and is in contact with the layer containing an organic compound and at least one of the first to third conductive layers; and attaching a first flexible substrate over the second electrode layer; and separating the substrate and the element-forming layer from each other at the separation layer so that the element-forming layer is supported by the first flexible substrate.

18. The method for manufacturing a semiconductor device according to claim 17, wherein the first electrode layer, the layer containing an organic compound, and the second electrode layer constitute parts of a storage element.

19. The method for manufacturing a semiconductor device according to claim 17, wherein the first electrode layer, the layer containing an organic compound, and the second electrode layer constitute parts of a light-emitting element.

20. The method for manufacturing a semiconductor device according to claim 17, wherein after separating the element-forming layer and the separation layer from each other, the element-forming layer is attached to a second flexible substrate.

* * * * *

UNITED STATES PATENT AND TRADEMARK OFFICE
CERTIFICATE OF CORRECTION

PATENT NO. : 7,611,965 B2
APPLICATION NO. : 11/510420
DATED : November 3, 2009
INVENTOR(S) : Suzuki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 424 days.

Signed and Sealed this

Twelfth Day of October, 2010

David J. Kappos
*Director of the United States Patent and Trademark Office*